(12) United States Patent
Hwang et al.

(10) Patent No.: US 11,335,260 B2
(45) Date of Patent: *May 17, 2022

(54) ORGANIC LIGHT EMITTING DIODE DISPLAY DEVICE INCLUDING DRIVING TRANSISTOR HAVING BOTTOM ELECTRODE BETWEEN SEMICONDUCTOR LAYER AND SUBSTRATE

(71) Applicant: SAMSUNG DISPLAY CO., LTD., Yongin-si (KR)

(72) Inventors: Young-In Hwang, Suwon-si (KR); Sung Ho Kim, Suwon-si (KR); Yong Ho Yang, Suwon-si (KR); Seong Min Wang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/191,782

(22) Filed: Mar. 4, 2021

(65) Prior Publication Data

US 2021/0193037 A1    Jun. 24, 2021

Related U.S. Application Data

(63) Continuation of application No. 17/160,488, filed on Jan. 28, 2021, which is a continuation of application (Continued)

(30) Foreign Application Priority Data

Jun. 28, 2018    (KR) ........................ 10-2018-0074950

(51) Int. Cl.
  *G09G 3/3233*    (2016.01)
  *H01L 51/00*     (2006.01)
  (Continued)

(52) U.S. Cl.
  CPC ......... *G09G 3/3233* (2013.01); *G09G 3/3258* (2013.01); *H01L 27/3262* (2013.01);
  (Continued)

(58) Field of Classification Search
  CPC ... G09G 2300/0819; G09G 2300/0861; G09G 2320/0233; G09G 2320/0257;
  (Continued)

(56) References Cited

U.S. PATENT DOCUMENTS 10,909,921 B2    2/2021   Hwang et al.
2006/0244741 A1* 11/2006  Kimura ................. G02F 1/1368
                                                       345/204
(Continued)

FOREIGN PATENT DOCUMENTS

JP    2001-100655    4/2001
JP    2003-297851    10/2003
(Continued)

OTHER PUBLICATIONS

Office Action dated Jun. 17, 2020 in Corresponding U.S. Appl. No. 16/356,142.

(Continued)

*Primary Examiner* — Chun-Nan Lin
(74) *Attorney, Agent, or Firm* — F. Chau & Associates, LLC

(57) ABSTRACT

An organic light emitting diode display includes a driving transistor and a compensation transistor. The driving transistor includes a first gate electrode disposed on a substrate, a polycrystalline semiconductor layer disposed on the first gate electrode of the driving transistor and including a first electrode, a second electrode, and a channel, and a second gate electrode disposed on the polycrystalline semiconductor layer of the driving transistor. The compensation transistor includes a polycrystalline semiconductor layer includ- (Continued)

ing a first electrode, a second electrode, and a channel, and a gate electrode disposed on the polycrystalline semiconductor layer of the compensation transistor.

19 Claims, 15 Drawing Sheets

Related U.S. Application Data

No. 16/356,142, filed on Mar. 18, 2019, now Pat. No. 10,909,921.

(51) Int. Cl.
*H01L 27/32* (2006.01)
*G09G 3/3258* (2016.01)
*H01L 27/12* (2006.01)
*H01L 29/786* (2006.01)

(52) U.S. Cl.
CPC ...... *H01L 27/3276* (2013.01); *H01L 51/0097* (2013.01); *G09G 2300/0819* (2013.01); *G09G 2320/0257* (2013.01); *H01L 27/124* (2013.01); *H01L 27/1222* (2013.01); *H01L 29/78648* (2013.01); *H01L 29/78675* (2013.01); *H01L 2251/5338* (2013.01)

(58) Field of Classification Search
CPC ........... G09G 2320/045; G09G 3/3233; G09G 3/3258; H01L 2251/5338; H01L 27/1222; H01L 27/124; H01L 27/3262; H01L 27/3276; H01L 29/78648; H01L 29/78675; H01L 51/0097
See application file for complete search history.

(56) References Cited

U.S. PATENT DOCUMENTS

| | | | |
|---|---|---|---|
| 2014/0353629 A1* | 12/2014 | Jin | ...................... H01L 27/3262 257/40 |
| 2017/0092199 A1 | 3/2017 | Park et al. | |
| 2017/0117343 A1 | 4/2017 | Oh et al. | |
| 2019/0027092 A1* | 1/2019 | Matsueda | ........... H01L 27/1255 |
| 2020/0005708 A1 | 1/2020 | Hwang et al. | |
| 2020/0243573 A1 | 7/2020 | Yamamoto et al. | |
| 2021/0183981 A1* | 6/2021 | Yang | ....................... H01L 51/56 |

FOREIGN PATENT DOCUMENTS

| | | |
|---|---|---|
| KR | 10-0570696 | 4/2006 |
| KR | 10-2017-0049705 | 5/2017 |
| KR | 10-2017-0124679 | 11/2017 |

OTHER PUBLICATIONS

Office Action dated Aug. 16, 2021 in Corresponding U.S. Appl. No. 17/160,488.
Final Office Action dated Dec. 9, 2021 in Corresponding U.S. Appl. No. 17/160,488.

* cited by examiner

ORGANIC LIGHT EMITTING DIODE DISPLAY DEVICE INCLUDING DRIVING TRANSISTOR HAVING BOTTOM ELECTRODE BETWEEN SEMICONDUCTOR LAYER AND SUBSTRATE

CROSS-REFERENCE TO RELATED APPLICATIONS

This application is a continuation of U.S. patent application Ser. No. 17/160,488 filed Jan. 28, 2021 which is a continuation of U.S. patent application Ser. No. 16/356,142 filed Mar. 18, 2019, issued as U.S. Pat. No. 10,909,921 on Feb. 2, 2021, which claims priority under 35 U.S.C. § 119 to Korean Patent Application No. 10-2018-0074950, filed in the Korean Intellectual Property Office on Jun. 28, 2018, the disclosures of which are incorporated by reference herein in their entirety.

TECHNICAL FIELD

Exemplary embodiments of the present invention relate to an organic light emitting diode display.

DISCUSSION OF THE RELATED ART

An organic light emitting diode display has a self-luminous characteristic. Since an organic light emitting diode display does not need a separate light source, unlike a liquid crystal display, it can have a relatively small thickness and weight. In addition, the organic light emitting diode display exhibits high-quality characteristics such as low power consumption, high luminance, high response speed, etc.

In general, an organic light emitting diode display includes a substrate, a plurality of thin film transistors positioned on the substrate, a plurality of insulating layers disposed between wires configuring the thin film transistors, and an organic light emitting element connected to the thin film transistor.

SUMMARY

Exemplary embodiments of the present invention reduce a thickness of a display device and improve a display device by, for example, remove or reducing instantaneous afterimages despite the presence of a protrusion(s) formed in a polycrystalline semiconductor of the display device.

According to an exemplary embodiment, an organic light emitting diode display includes a substrate, a pixel disposed on the substrate, a scan line, a data line, a driving voltage line, and an initialization voltage line. The scan line, the data line, the driving voltage line, and the initialization voltage line are connected to the pixel. The pixel includes an organic light emitting element, a first switching transistor connected to the scan line, a driving transistor that applies a current to the organic light emitting element, and a compensation transistor that compensates an operation of the driving transistor. The driving transistor includes a first gate electrode disposed on the substrate, a polycrystalline semiconductor layer disposed on the first gate electrode and including a first electrode, a second electrode, and a channel. The compensation transistor includes a polycrystalline semiconductor layer including a first electrode, a second electrode, and a channel, and a first gate electrode disposed on the polycrystalline semiconductor layer of the compensation transistor.

In an exemplary embodiment, the driving transistor further includes a second gate electrode disposed on the polycrystalline semiconductor layer of the driving transistor.

In an exemplary embodiment, the second gate electrode of the driving transistor receives a driving voltage that flows to the driving voltage line.

In an exemplary embodiment, the driving transistor further includes an overlapping layer disposed between the substrate and the first gate electrode of the driving transistor.

In an exemplary embodiment, the driving voltage that flows to the driving voltage line is applied to the overlapping layer.

In an exemplary embodiment, the organic light emitting diode display further includes a driving voltage application part that applies the driving voltage to the overlapping layer and the second gate electrode of the driving transistor.

In an exemplary embodiment, the organic light emitting diode display further includes a second switching transistor. The first switching transistor is connected to the scan line and the data line, and the second switching transistor is connected to the scan line and the first gate electrode of the driving transistor.

In an exemplary embodiment, the first switching transistor includes a polycrystalline semiconductor layer including a first electrode, a second electrode, and a channel, and a first gate electrode disposed on the polycrystalline semiconductor layer of the first switching transistor.

In an exemplary embodiment, the first switching transistor further includes a second gate electrode disposed under the polycrystalline semiconductor layer of the first switching transistor. A driving voltage that flows to the driving voltage line is applied to the second gate electrode of the first switching transistor.

In an exemplary embodiment, the first switching transistor includes a gate electrode disposed on the substrate, and a polycrystalline semiconductor layer disposed on the gate electrode of the first switching transistor and including a first electrode, a second electrode, and a channel.

In an exemplary embodiment, the second switching transistor includes a polycrystalline semiconductor layer including a first electrode, a second electrode, and a channel, and a first gate electrode disposed on the polycrystalline semiconductor layer of the second switching transistor.

In an exemplary embodiment, the second switching transistor further includes a second gate electrode disposed under the polycrystalline semiconductor layer of the second switching transistor. The second gate electrode of the second switching transistor receives a driving voltage that flows to the driving voltage line.

In an exemplary embodiment, the first switching transistor includes a polycrystalline semiconductor layer including a first electrode, a second electrode, and a channel, and a first gate electrode disposed on the polycrystalline semiconductor layer of the first switching transistor.

In an exemplary embodiment, the first switching transistor further includes a second gate electrode disposed under the polycrystalline semiconductor layer of the first switching transistor. The second gate electrode of the first switching transistor receives the driving voltage that flows to the driving voltage line.

In an exemplary embodiment, the driving transistor further includes an overlapping layer disposed between the substrate and the first gate electrode of the driving transistor. The overlapping layer receives the driving voltage, and the overlapping layer is electrically connected to the second gate electrode of the second switching transistor such that the driving voltage is applied to the second gate electrode of the second switching transistor.

In an exemplary embodiment, the organic light emitting diode display further includes a driving voltage application part. The driving transistor further includes a second gate electrode disposed on the polycrystalline semiconductor layer of the driving transistor, and the driving voltage application part applies the driving voltage to the overlapping layer and the second gate electrode of the driving transistor.

In an exemplary embodiment, the second switching transistor includes a gate electrode disposed on the substrate, and a polycrystalline semiconductor layer disposed on the gate electrode of the second switching transistor and including a first electrode, a second electrode, and a channel.

In an exemplary embodiment, the compensation transistor initializes the first gate electrode of the driving transistor.

In an exemplary embodiment, the compensation transistor further includes a second gate electrode disposed under the polycrystalline semiconductor layer of the compensation transistor. The second gate electrode of the compensation transistor receives a driving voltage that flows to the driving voltage line.

According to an exemplary embodiment, an organic light emitting diode display includes a substrate, a pixel disposed on the substrate, a scan line, a data line, a driving voltage line, and an initialization voltage line. The scan line, the data line, the driving voltage line, and the initialization voltage line are connected to the pixel. The pixel includes an organic light emitting element, a first switching transistor connected to the scan line, a driving transistor that applies a current to the organic light emitting element, and a compensation transistor that compensates an operation of the driving transistor. The driving transistor includes a first gate electrode disposed on the substrate, a polycrystalline semiconductor layer disposed on the first gate electrode and including a first electrode, a second electrode, and a channel, and a second gate electrode disposed on the polycrystalline semiconductor layer of the driving transistor. The compensation transistor includes a polycrystalline semiconductor layer including a first electrode, a second electrode, and a channel, and a first gate electrode disposed on the polycrystalline semiconductor layer of the compensation transistor. The compensation transistor does not include a second gate electrode disposed under the polycrystalline semiconductor layer of the compensation transistor.

According to exemplary embodiments of the present invention, although a protrusion(s) may be formed in the polycrystalline semiconductor layer, since the gate electrode of the driving transistor is disposed under the polycrystalline semiconductor layer, the thickness of the gate insulating layer may be reduced and the thickness of the display device may be reduced. Also, because the gate electrode of the driving transistor is disposed under the polycrystalline semiconductor, if the thickness of the gate insulating layer is reduced, a characteristic (hysteresis) of the driving transistor is reduced such that instantaneous afterimages are not generated in the displayed image.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
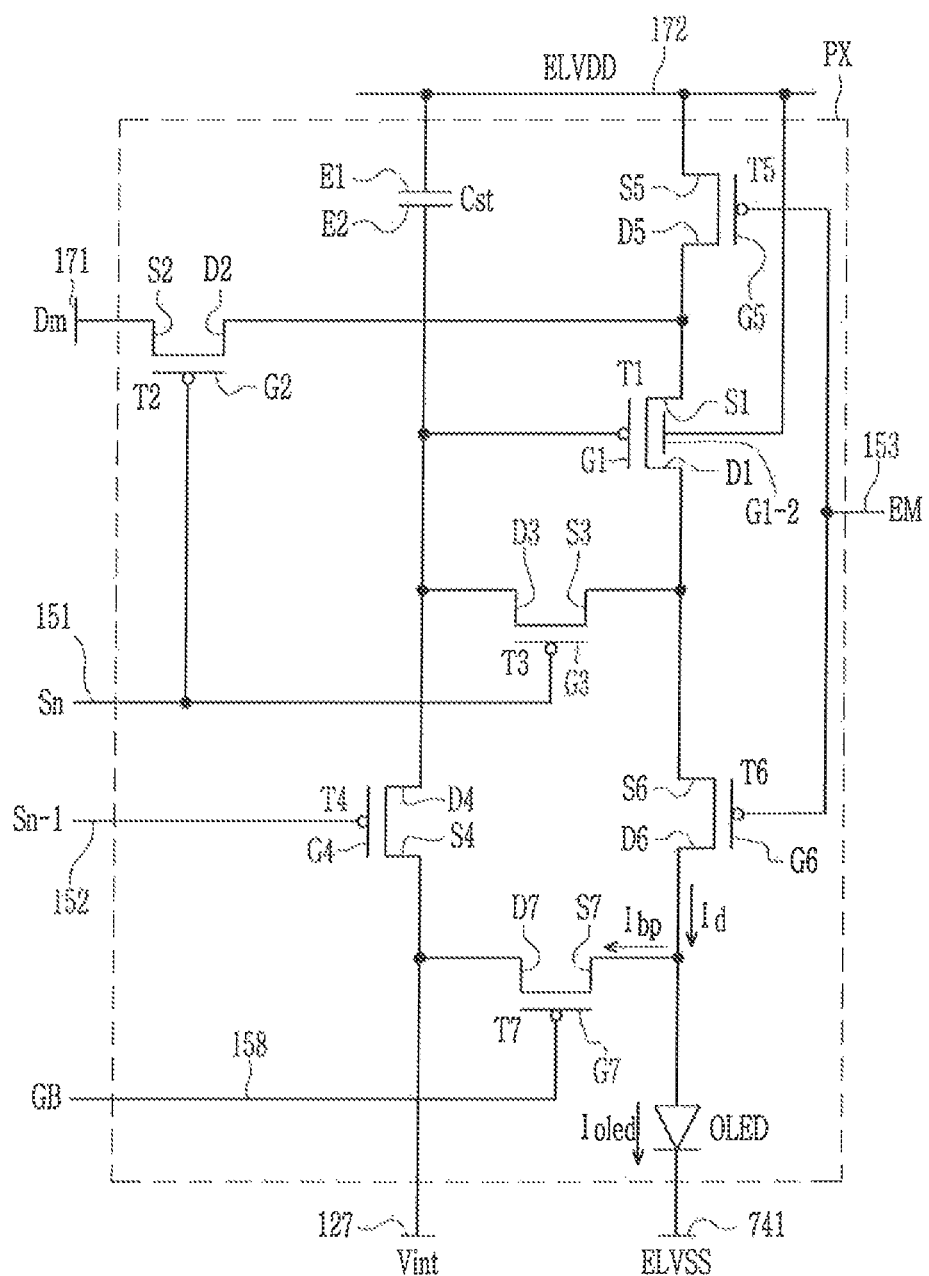
FIG. 1 is an equivalent circuit diagram of one pixel of an organic light emitting diode display according to an exemplary embodiment.

Exemplary embodiments of the present invention will be described more fully hereinafter with reference to the accompanying drawings. Like reference numerals may refer to like elements throughout the accompanying drawings.

It will be understood that when an element such as a layer, film, region, or substrate is referred to as being "on" another element, it can be directly on the other element or intervening elements may also be present.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Descriptions of features or aspects within each exemplary embodiment should typically be considered as available for other similar features or aspects in other exemplary embodiments, unless the context clearly indicates otherwise.

An organic light emitting diode display according to an exemplary embodiment is described with reference to FIGS. 1 to 3.

FIG. 1 is an equivalent circuit diagram of one pixel of an organic light emitting diode display according to an exemplary embodiment. FIG. 2 is a timing diagram of signals applied to one pixel of an organic light emitting diode display according to an exemplary embodiment. FIG. 3 is a cross-sectional view of a plurality of transistors included in one pixel of an organic light emitting diode display according to an exemplary embodiment (e.g., the exemplary embodiment illustrated in FIG. 1).

Referring to FIG. 1, a pixel PX of an organic light emitting diode display includes a plurality of transistors T1, T2, T3, T4, T5, T6, T7, T8, and T9, a storage capacitor Cst, and an organic light emitting diode OLED, which are connected to signal lines 127, 151, 152, 153, 158, 171, 172, and 741.

Figure 3:
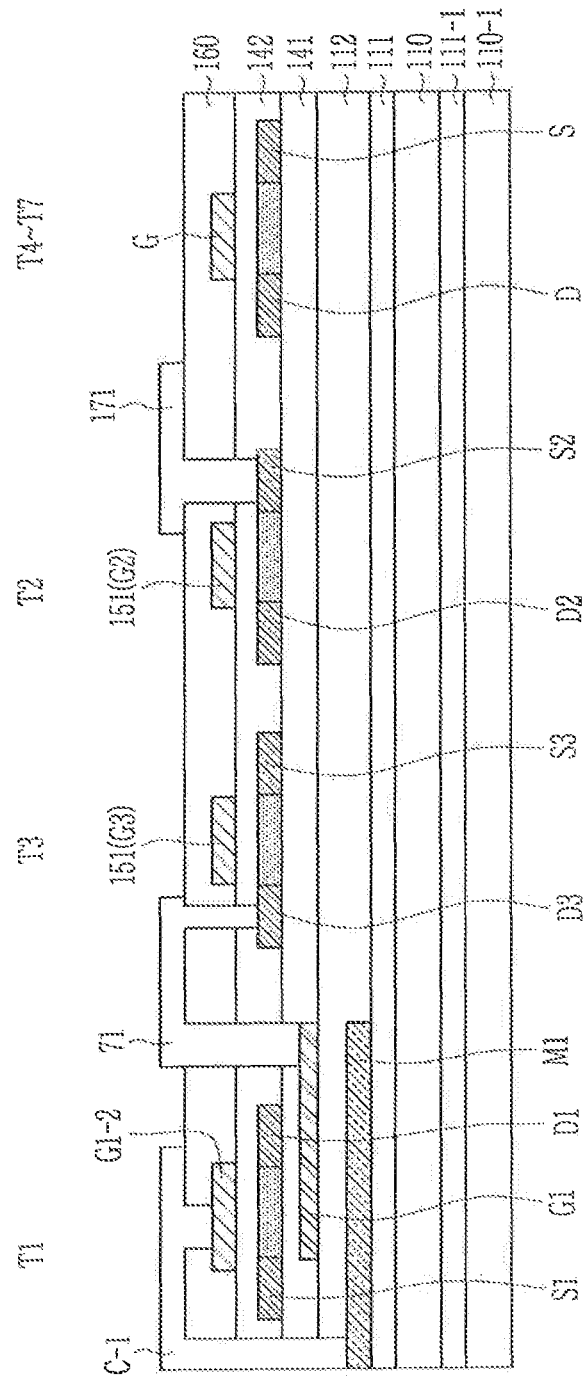
FIG. 3 is a cross-sectional view of a plurality of transistors included in one pixel of an organic light emitting diode display according to an exemplary embodiment.

Referring to FIG. 3, the driving transistor T1 includes a gate electrode G1 (referred to as a driving gate electrode) disposed under a polycrystalline semiconductor layer. The polycrystalline semiconductor layer includes S1, D1, and a channel disposed therebetween. In contrast, in the other transistors T2-T7, gate electrodes G2, G3, G4, G5, G6, and G7 are disposed on the polycrystalline semiconductor layer. In FIG. 3, G4, G5, G6 and G7 are illustrated as G, S4, S5, S6 and S7 are illustrated as S, and D4, D5, D6 and D7 are illustrated as D. In the driving transistor T1, the gate electrode G1 is not affected by the protrusion of the polycrystalline semiconductor layer, unlike the gate electrodes G2, G3, G4, G5, G6, and G7 of the other transistors T2-T7, which may be affected. In an exemplary embodiment, a main function of supplying the current to the organic light emitting diode OLED is done using the driving transistor T1, and the other transistors T2-T7 perform only a function of preparing or initializing the operation of the driving transistor T1. As a result, the influence on the display quality due to the protrusion of the polycrystalline semiconductor layer may be reduced.

Referring to FIGS. 1 and 3, the driving transistor T1 providing the current to the organic light emitting diode OLED further includes an overlapping layer M1 and a second gate electrode G1-2 overlapping the overlapping layer M1. For convenience of illustration, the overlapping layer M1 is not shown in FIG. 1. According to an exemplary embodiment, the overlapping layer M1 may be omitted. The second gate electrode G1-2 is disposed on a side opposite to the gate electrode G1 of the driving transistor T1, with the semiconductor layer in which the channel of the driving transistor T1 is formed being disposed therebetween. The overlapping layer M1 is disposed under the gate electrode G1 of the driving transistor T1. The second gate electrode G1-2 and the overlapping layer M1 are electrically connected to each other, and a driving voltage ELVDD is applied thereto. A predetermined voltage (the driving voltage ELVDD) is applied to the second gate electrode G1-2 such that the second gate electrode G1-2 does not function as the gate electrode of the transistor. As shown in FIG. 3, the second gate electrode G1-2 is disposed on the channel of the polycrystalline semiconductor layer, which includes S1, D1, and a channel disposed therebetween.

The pixel PX according to an exemplary embodiment includes a total of seven transistors T1 to T7.

The seven transistors include the driving transistor T1 that provides the current to the organic light emitting diode OLED, and also include a second transistor T2 connected to a scan line 151 and a data line and that provides the data voltage in the pixel PX. The third transistor T3 is also connected to the scan line 151. The second transistor T2 and the third transistor T3 connected to the scan line 151 may each be referred to as a switching transistor. The other transistors used for operating the organic light emitting diode OLED may include a fourth transistor T4, a fifth transistor T5, a sixth transistor T6, and a seventh transistor T7, and each of these transistors may be referred to as a compensation transistor.

The plurality of signal lines 127, 151, 152, 153, 158, 171, 172, and 741 may include the scan line 151, a previous scan line 152, a light emission control line 153, a bypass control line 158, a data line 171, a driving voltage line 172, an initialization voltage line 127, and a common voltage line 741. The bypass control line 158 may be a part of the previous scan line 152 or may be electrically connected thereto.

The scan line 151 is connected to a gate driver and transmits a scan signal Sn to the second transistor T2 and the third transistor T3. The previous scan line 152 is connected to the gate driver and transmits a previous scan signal Sn−1 applied to the pixel PX disposed at the previous stage to the fourth transistor T4. The light emission control line 153 is connected to a light emission controller and transmits a light emission control signal EM controlling a time that the organic light emitting diode OLED is emitted to the fifth transistor T5 and the sixth transistor T6. The bypass control line 158 transmits a bypass signal GB to the seventh transistor T7, and may transmit the same signal as the previous scan signal Sn−1 according to an exemplary embodiment.

The data line 171 is a wire that transmits a data voltage Dm generated from a data driver. A luminance at which the organic light emitting diode OLED (also referred to as an organic light emitting device) is emitted is changed depending on the data voltage Dm. The driving voltage line 172 applies the driving voltage ELVDD, the initialization voltage line 127 transmits an initialization voltage Vint initializing the driving transistor T1, and the common voltage line 741 applies a common voltage ELVSS. The voltages applied to the driving voltage line 172, the initialization voltage line 127, and the common voltage line 741 may be a predetermined voltage, respectively.

Next, the plurality of transistors are described in detail.

The driving transistor T1 controls a magnitude of the current output depending on the applied data voltage Dm, and an output driving current Id is applied to the organic light emitting diode OLED. As a result, a brightness of the organic light emitting diode OLED is controlled depending on the data voltage Dm. For this purpose, the first electrode S1 (also referred to as an input terminal) of the driving transistor T1 is disposed so as to receive the driving voltage ELVDD, and is connected to the driving voltage line 172 via the fifth transistor T5. The first electrode S1 of the driving transistor T1 is also connected to the second electrode D2 of the second transistor T2, and thereby also receives the data voltage Dm. The second electrode D1 (also referred to as an output terminal) is disposed so as to output the current toward the organic light emitting diode OLED, and is connected to an anode of the organic light emitting diode OLED via the sixth transistor T6. The gate electrode G1 is connected to one electrode (a second storage electrode E2) of the storage capacitor Cst. Accordingly, the voltage of the gate electrode G1 is changed depending on the voltage stored to the storage capacitor Cst, and as a result, the driving current Id output by the driving transistor T1 is changed. The gate electrode G1 is disposed between the polycrystalline semiconductor layer and the substrate, thereby being disposed under the polycrystalline semiconductor layer. Also, the second gate electrode G1-2 is disposed on the polycrystalline semiconductor layer and directly receives the driving voltage ELVDD. The driving voltage ELVDD is also applied to the overlapping layer M1 electrically connected to the second gate electrode G1-2, and the overlapping layer M1 is disposed between the gate electrode G1 and the substrate. The second gate electrode G1-2 shifts a characteristic (a threshold voltage value) of the driving transistor T1 due to the driving voltage ELVDD in the channel region (a region between D1 and S1) of the polycrystalline semiconductor such that the characteristic of the driving transistor T1 is improved.

The second transistor T2 accepts the data voltage Dm in the pixel PX. The gate electrode G2 is connected to the scan line 151, and the first electrode S2 is connected to the data line 171. The second electrode D2 of the second transistor T2 is connected to the first electrode S1 of the driving transistor T1. When the second transistor T2 is turned on according to the scan signal Sn transmitted through the scan line 151, the data voltage Dm transmitted through the data line 171 is transmitted to the first electrode S1 of the driving transistor T1. The gate electrode G2 is disposed on the polycrystalline semiconductor layer in which the channel of the second transistor T2 is disposed.

The third transistor T3 transmits the compensation voltage (the voltage Dm+Vth) of which the data voltage Dm is changed by the driving transistor T1 to the second storage electrode E2 of the storage capacitor Cst. The gate electrode G3 of the third transistor T3 is connected to the scan line 151. The first electrode S3 of the third transistor T3 is connected to the second electrode D1 of the driving transistor T1, and the second electrode D3 of the third transistor T3 is connected to the second storage electrode E2 of the storage capacitor Cst and the gate electrode G1 of the driving transistor T1. The third transistor T3 is turned on depending on the scan signal Sn transmitted through the scan line 151. When turned on, the third transistor T3 connects the gate electrode G1 and the second electrode D1 of the driving transistor T1, and connects the second electrode D1 of the driving transistor T1 and the second storage electrode E2 of the storage capacitor Cst. The gate electrode G3 is disposed on the polycrystalline semiconductor layer in which the channel of the third transistor T3 is disposed.

The fourth transistor T4 has a function of initializing the gate electrode G1 of the driving transistor T1 and the second storage electrode E2 of the storage capacitor Cst. The gate electrode G4 of the fourth transistor T4 is connected to the previous scan line 152 and the first electrode S4 is connected to the initialization voltage line 127. The second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transmits the initialization voltage Vint to the gate electrode G1 of the driving transistor T1 and the second storage electrode E2 of the storage capacitor Cst depending on the previous scan signal Sn−1 transmitted through the previous scan line 152. Accordingly, the gate voltage of the gate electrode G1 of the driving transistor T1 and the storage capacitor Cst are initialized. The initialization voltage Vint may be a voltage that is capable of turning on the driving transistor T1 by having a low voltage value. The gate electrode G4 is disposed on the polycrystalline semiconductor layer in which the channel of the fourth transistor T4 is disposed.

The fifth transistor T5 has a function of transmitting the driving voltage ELVDD to the driving transistor T1. The gate electrode G5 is connected to the light emission control line 153 and the first electrode S5 is connected to the driving voltage line 172. The second electrode D5 of the fifth transistor T5 is connected to the first electrode S1 of the driving transistor T1. The gate electrode G5 is disposed on the polycrystalline semiconductor layer in which the channel of the fifth transistor T5 is disposed.

The sixth transistor T6 has a function of transmitting the driving current Id output from the driving transistor T1 to the organic light emitting diode OLED. The gate electrode G6 is connected to the light emission control line 153, and the first electrode S6 is connected to the second electrode D1 of the driving transistor T1. The second electrode D6 of the sixth transistor T6 is connected to the anode of the organic light emitting diode OLED. The gate electrode G6 is disposed on the polycrystalline semiconductor layer in which the channel of the sixth transistor T6 is disposed.

The fifth transistor T5 and the sixth transistor T6 are simultaneously turned on depending on the light emission control signal EM transmitted through the light emission control line 153. When the driving voltage ELVDD is transmitted to the first electrode S1 of the driving transistor T1 through the fifth transistor T5, the driving transistor T1 outputs the driving current Id depending on the voltage (e.g., the voltage of the second storage electrode E2 of the storage capacitor Cst) of the gate electrode G1 of the driving transistor T1. The output driving current Id is transmitted to the organic light emitting diode OLED through the sixth transistor T6. While a current Ioled flows to the organic light emitting diode OLED, the organic light emitting diode OLED emits the light.

The seventh transistor T7 has a function of initializing the anode of the organic light emitting diode OLED. The gate electrode G7 is connected to the bypass control line 158, the first electrode S7 is connected to the anode of the organic light emitting diode OLED, and the second electrode D7 is connected to the initialization voltage line 127. The bypass control line 158 may be connected to the previous scan line 152, and the bypass signal GB is applied with the signal with the same timing as the previous scan signal Sn−1. In an exemplary embodiment, the bypass control line 158 is not connected to the previous scan line 152, and may transmit a separate signal from the previous scan signal Sn−1. When the seventh transistor T7 is turned on depending on the bypass signal GB, the initialization voltage Vint is applied to the anode of the organic light emitting diode OLED to be initialized. The gate electrode G7 is disposed on the polycrystalline semiconductor layer in which the channel of the seventh transistor T7 is disposed.

The pixel PX also includes the storage capacitor Cst. The data voltage passes through the driving transistor T1 and is applied to the storage capacitor Cst to be stored.

A first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage (the gate-source voltage Vgs of the driving transistor T1) of the gate electrode G1 of the driving transistor T1, the data voltage Dm is applied through the second electrode D3 of the third transistor T3, and the initialization voltage Vint is applied through the second electrode D4 of the fourth transistor T4.

The pixel PX also includes the organic light emitting diode OLED, the anode of the organic light emitting diode OLED is connected to the second electrode D6 of the sixth transistor T6 and the first electrode S7 of the seventh transistor T7, and the cathode is connected to the common voltage line 741 that transmits the common voltage ELVSS.

In the exemplary embodiment of FIG. 1, the pixel circuit includes seven transistors T1-T7 and one capacitor Cst. However, the pixel circuit is not limited thereto. For example, according to exemplary embodiments, the number of transistors, the number of capacitors, and their connections may be variously changed.

The organic light emitting diode display includes a display area in which an image is displayed, and the pixels PX are arranged in various forms such as a matrix in the display area.

The operation of one pixel of the organic light emitting diode display according to an exemplary embodiment is now described with reference to FIGS. 1 and 2.

During an initialization period, the previous scan signal Sn−1 of a low level is supplied to the pixel PX through the previous scan line 152. Thus, the fourth transistor T4 that receives previous scan signal Sn−1 is turned on, and the initialization voltage Vint is applied to the gate electrode G1 of the driving transistor T1 and the second storage electrode E2 of the storage capacitor Cst through the fourth transistor T4. As a result, the driving transistor T1 and the storage capacitor Cst are initialized. The initialization voltage Vint is a low voltage such that the driving transistor T1 may be turned on.

During the initialization period, the bypass signal GB of a low level is also applied to the seventh transistor T7. Thus, the seventh transistor T7 that receives the bypass signal GB is turned on such that the initialization voltage Vint is applied to the anode of the organic light emitting diode OLED through the seventh transistor T7. As a result, the anode of the organic light emitting diode OLED is also initialized.

Next, during a data writing period (hereinafter referred to as a writing period), the scan signal Sn of a low level is supplied to the pixel PX through the scan line 151. The second transistor T2 and the third transistor T3 are turned on by the scan signal Sn of a low level.

When the second transistor T2 is turned on, the data voltage Dm is input to the first electrode S1 of the driving transistor T1 after passing through the second transistor T2.

Also, during the data writing period, the third transistor T3 is turned on, and as a result, the second electrode D2 of the driving transistor T1 is electrically connected to the gate electrode G1 and the second storage electrode E2 of the storage capacitor Cst. The gate electrode G1 and the second electrode D2 of the driving transistor T1 are connected to be diode-connected. Also, the low voltage (the initialization voltage Vint) is applied to the gate electrode G1 of the driving transistor T1 during the initialization period such that the driving transistor T1 is in the turned-on state. As a result, the data voltage Dm input to the first electrode S1 of the driving transistor T1 passes through the channel of the driving transistor T1 and is output from the second electrode D1, and is then stored in the second storage electrode E2 of the storage capacitor Cst through the third transistor T3. In this case, the voltage applied to the second storage electrode E2 is changed according to the threshold voltage Vth of the driving transistor T1, and when the data voltage Dm is applied to the first electrode S1 of the driving transistor T1 and the initialization voltage Vint is applied to the gate electrode G1 of the driving transistor T1, the voltage output to the second electrode D1 may have the value (Vgs+Vth). Here, the voltage Vgs is a difference between the voltages applied to the gate electrode G1 and the first electrode S1 of the driving transistor T1, thereby having the value (Dm−Vint). Therefore, the voltage output from the second electrode D1 and stored in the second storage electrode E2 may have the value (Dm−Vint+Vth).

Next, during the light emission period, the light emission control signal EM supplied from the light emission control line 153 has the value of a low level such that the fifth transistor T5 and the sixth transistor T6 are turned on.

Since the fifth transistor T5 and the sixth transistor T6 are turned on, the driving voltage ELVDD is applied to the first electrode S1 of the driving transistor T1, and the second electrode D1 of the driving transistor T1 is connected to the organic light emitting diode OLED. The driving current Id is generated depending on the voltage difference between the voltage of the gate electrode G1 of the driving transistor T1 and the voltage (e.g., the driving voltage ELVDD) of the first electrode S1. The driving current Id of the driving transistor T1 may have a value that is proportional to the square of the value (Vgs−Vth). Here, the value Vgs is the same as the difference in voltages applied to both terminals of the storage capacitor Cst, and the value Vgs is (Vg−Vs), thereby having the value (Dm−Vint+Vth−ELVDD). Here, when the value (Vgs−Vth) is obtained by subtracting the value Vth, the value (Dm−Vint−ELVDD) is obtained. That is, the driving current Id of the driving transistor T1 has the value regardless of the threshold voltage Vth of the driving transistor T1.

Therefore, although the driving transistors T1 disposed in each pixel PX have the different threshold voltages Vth due to a process distribution, the output current of each driving transistor T1 may be constant, thereby improving a non-uniformity characteristic thereof.

In the driving transistor T1, the gate electrode G1 is formed under the polycrystalline semiconductor layer. As a result, even if the protrusion is formed in the polycrystalline semiconductor layer, the driving transistor T1 is operated properly regardless of the protrusion (e.g., the protrusion does not negatively affect the driving transistor T1), and a constant characteristic is obtained. As a result, the display device may be free from display defects such as instantaneous afterimages.

In the above equation, the value Vth may have a value that is slightly larger than 0 or a negative value in the case of the P-type transistor using the polycrystalline semiconductor. Also, expression of + and − may be changed according to a direction in which the voltage is calculated. However, there is no change in the point that the driving current Id as the output current of the driving transistor T1 may have a value that does not depend on the threshold voltage Vth.

When the above-described light emission period is ended, the initialization period is again started and the same operations are repeated from the beginning.

For the first electrode and the second electrode of the plurality of transistors T1, T2, T3, T4, T5, T6, and T7, one may be the source electrode S and the other may be the drain electrode D according to the direction of the application of the voltage or the current.

According to an exemplary embodiment, while the seventh transistor T7 in the initialization period initializes the anode of the organic light emitting diode OLED, a small amount of the current emitted in the condition that the driving transistor T1 is turned on may also be prevented from flowing toward the organic light emitting diode OLED. In this case, the small amount of the current is discharged as a bypass current Ibp to the initialization voltage Vint terminal through the seventh transistor T7. As a result, since the organic light emitting diode OLED does not emit unnecessary light, a black gray may be more clearly displayed and a contrast ratio may also be improved. In this case, the bypass signal GB may be a signal of different timing from that of the previous scan signal Sn−1. According to an exemplary embodiment, the seventh transistor T7 may be omitted.

Further, in the above-operated pixel PX, as the driving voltage ELVDD is applied to the second gate electrode G1-2 of the driving transistor T1, the characteristic (the threshold voltage) of the driving transistor T1 is shifted such that the display quality is improved.

Next, a cross-sectional structure of transistors included in the organic light emitting diode display is described with reference to FIG. 3.

FIG. 3 shows the cross-section of a plurality of transistors included in one pixel of the organic light emitting diode display. From left to right, the driving transistor T1, the third transistor T3, and the second transistor T2 are shown, followed by the fourth transistor T4 to the seventh transistor T7. The cross-sections of the fourth transistor T4 to the seventh transistor T7 are the same. Thus, for convenience of illustration, these cross-sections are grouped together and shown as one. In this regard, in FIG. 3, G corresponds to G4 to G7, D corresponds to D4 to D7, and S corresponds to S4 to S7.

According to an exemplary embodiment, the organic light emitting diode display includes substrates 110 and 110-1 including, for example, plastic or polyimide (PI), and barrier layers 111 and 111-1 respectively disposed thereon. The substrates 110 and 110-1 may be collectively referred to as a substrate, and the barrier layers 111 and 111-1 may be collectively referred to as a barrier layer. According to exemplary embodiments, the substrate and the barrier layer may be formed with the same number, and unlike as shown in FIG. 3, they may contain only one pair, or three or more pairs may be formed. The barrier layers 111 and 111-1 may be formed to reduce an influence applied to the flexible substrates 110 and 110-1 when forming overlying layers.

Now, the cross-section of the driving transistor T1 is described.

The overlapping layer M1 is disposed on the upper barrier layer 111-1, and the overlapping layer is covered by a buffer layer 112. The gate electrode G1 is formed on the buffer layer 112, and the gate electrode G1 is covered by a first gate insulating layer 141. The polycrystalline semiconductor layer is disposed on the first gate insulating layer 141. The polycrystalline semiconductor layer includes the first electrode S1, the second electrode D1, and the channel layer disposed therebetween.

The polycrystalline semiconductor layer is covered by a second gate insulating layer 142, and the second gate electrode G1-2 is formed on the second gate insulating layer 142. The second gate electrode G1-2 is covered by an interlayer insulating layer 160.

A data conductor is formed on the interlayer insulating layer 160. The data conductor includes the data line 171 and the driving voltage line 172 that transmits the driving voltage ELVDD.

The driving voltage line 172 includes a driving voltage application part C-1 connected to the second gate electrode G1-2 and the overlapping layer M1 through openings respectively exposing the second gate electrode G1-2 and the overlapping layer M1. The driving voltage application part C-1 may be a part from which the driving voltage line 172 extends or a part that is only electrically connected.

The gate electrode G1 and the second gate electrode G1-2 are disposed above and below the channel of the driving transistor T1. In an exemplary embodiment, the gate electrode G1 and the second gate electrode G1-2 may have a width corresponding to (e.g., substantially equal to) the width of the channel. However, in an exemplary embodiment, as shown in FIG. 3, the structure of the gate electrode G1 extends toward the third transistor T3 (e.g., toward the right in FIG. 3) such that the gate electrode G1 disposed under the channel is connected to the second electrode D3 of the third transistor T3. In an exemplary embodiment, except for this extension part, the gate electrode G1 has the width corresponding to (e.g., substantially equal to) the width of the channel of the driving transistor T1.

The second gate electrode G1-2 may be used as a mask when doping the polycrystalline semiconductor layer. As a result, the width of the second gate electrode G1-2 may accord with the width of the channel. According to an exemplary embodiment, as the driving transistor T1 includes the second gate electrode G1-2 and the overlapping layer M1 as a part receiving the driving voltage ELVDD, the overlapping layer M1 may be omitted.

The driving transistor T1 has a bottom gate (e.g., the second gate electrode G1-2), and the driving voltage ELVDD is applied to the second gate electrode G1-2, thereby shifting the characteristic of the channel. As a result, according to exemplary embodiments, defects that may be generated due to a protrusion(s) (see FIG. 4) formed in the polycrystalline semiconductor may be reduced or eliminated by using the bottom gate.

Next, the cross-section of the third transistor T3 is described.

The buffer layer 112 is disposed on the upper barrier layer 111-1, and the first gate insulating layer 141 is disposed on the buffer layer 112.

The polycrystalline semiconductor layer is disposed on the first gate insulating layer 141. The polycrystalline semiconductor layer includes the first electrode S3, the second electrode D3, and the channel layer disposed therebetween.

The polycrystalline semiconductor layer is covered by the second gate insulating layer 142, and the gate electrode G3 (151) is formed on the second gate insulating layer 142. The gate electrode G3 (151) is covered by the interlayer insulating layer 160.

A connection part 71 is formed on the interlayer insulating layer 160. The connection part 71 electrically connects the second electrode D3 of the third transistor T3 and the gate electrode G1 of the driving transistor T1 through openings respectively exposing the second electrode D3 of the third transistor T3 and the gate electrode G1 of the driving transistor T1. Since the output of the driving transistor T1 is changed depending the voltage of the gate electrode G1, the voltage output to the second electrode D3 of the third transistor T3 affects the output of the driving transistor T1.

The gate electrode G3 is disposed on the channel of the third transistor T3, and has a width corresponding to (e.g., substantially equal to) the width of the channel. The gate electrode G3 may be used as a mask when doping the polycrystalline semiconductor layer.

As described above, unlike the driving transistor T1, in an exemplary embodiment, the third transistor T3 has the top gate and does not include a bottom gate. Thus, unlike the driving transistor T1, in an exemplary embodiment, the third transistor T3 does not include a structure that shifts the characteristic of the channel.

Next, the cross-section of the second transistor T2 is described.

The buffer layer 112 is disposed on the upper barrier layer 111-1, and the first gate insulating layer 141 is disposed on the buffer layer 112.

The polycrystalline semiconductor layer is disposed on the first gate insulating layer 141. The polycrystalline semiconductor layer includes the first electrode S2, the second electrode D2, and the channel layer disposed therebetween.

The polycrystalline semiconductor layer is covered by the second gate insulating layer 142, and the gate electrode G2 (151) is formed on the second gate insulating layer 142. The gate electrode G2 (151) is covered by the interlayer insulating layer 160.

The data line 171 is formed on the interlayer insulating layer 160. The data line 171 is connected to the first electrode S2 of the second transistor T2 through an opening exposing the first electrode S2 of the second transistor T2. When the second transistor T2 is turned on, the data voltage is input to the corresponding pixel PX.

The gate electrode G2 is disposed on the channel of the second transistor T2, and has a width corresponding to (e.g., substantially equal to) the width of the channel. The gate electrode G2 may be used as a mask when doping the polycrystalline semiconductor layer.

As described above, in an exemplary embodiment, unlike the driving transistor T1, the second transistor T2 has the top gate and does not include a bottom gate. Thus, in an exemplary embodiment, the second transistor T2 does not include a structure that shifts the characteristic of the channel.

Hereinafter, the fourth to seventh transistors T4-T7 included in the pixel PX are grouped and described. The first electrode of each transistor is indicated by S, the second electrode thereof is indicated by D, and the gate electrode thereof is indicated by G.

The buffer layer 112 is disposed on the upper barrier layer 111-1, and the first gate insulating layer 141 is disposed on the buffer layer 112. The polycrystalline semiconductor layer is disposed on the first gate insulating layer 141. The polycrystalline semiconductor layer includes the first electrode S, the second electrode D, and the channel layer disposed therebetween.

The polycrystalline semiconductor layer is covered by the second gate insulating layer 142, and the gate electrode G is formed on the second gate insulating layer 142. The gate electrode G is covered by the interlayer insulating layer 160.

The fourth to seventh transistors T4 to T7 have the connection relationship shown in FIG. 1 and are disposed in the pixel PX.

The gate electrode G is disposed on the channel of the fourth to seventh transistors T4 to T7, and has a width corresponding to (e.g. substantially equal to) the width of the channel. The gate electrode G may be used as a mask when doping the polycrystalline semiconductor layer.

As described above, in an exemplary embodiment, the fourth to seventh transistors T4 to T7 also have the top gate and do not include a bottom gate. As a result, in an exemplary embodiment, the fourth to seventh transistors T4 to T7 do not include a structure that shifts the characteristic of the channel.

In the organic light emitting diode display having the above-described structure, only the driving transistor T1 executing the main operation in the pixel PX has the bottom gate (the gate electrode disposed under the polycrystalline semiconductor layer), and the rest of the transistors have the top gate (the gate electrode disposed on the polycrystalline semiconductor layer) and do not have a bottom gate.

The polycrystalline semiconductor layer is formed by forming the semiconductor layer of amorphous silicon and irradiating a laser to the semiconductor layer for crystallization. A protrusion(s) may be formed in the polycrystalline semiconductor layer in the crystallization step, and the expanded cross-section in the structure using the top gate is described with reference to FIG. 4.

Figure 4:
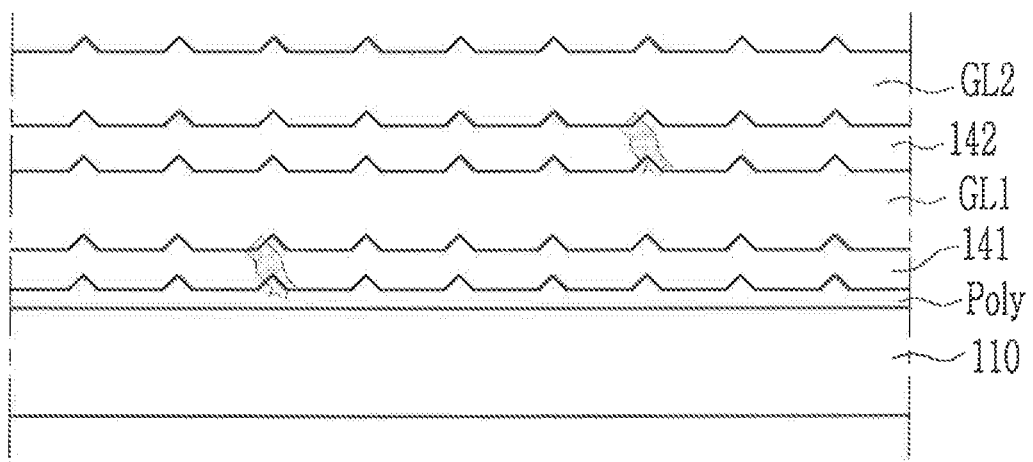
FIG. 4 is a view schematically showing a structure of overlying layers due to a protrusion generated in a polycrystalline semiconductor.

FIG. 4 is a view schematically showing a structure of overlying layers due to a protrusion generated in a polycrystalline semiconductor.

The cross-sectional view in FIG. 4 shows the structure using the top gate in the driving transistor T1. Two gate layers GL1 and GL2 are formed on the polycrystalline semiconductor layer Poly.

The polycrystalline semiconductor layer Poly having the protrusion is disposed on the substrate 110. The protrusion formed in the polycrystalline semiconductor layer Poly is formed so as to form the convex protrusion in the first and second gate insulating layers 141 and 142 and the two gate layers GL1 and GL2 disposed thereon. As a result, the charges are gathered on the protrusion of the gate layers GL1 and GL2, and the thickness of the first and second gate insulating layers 141 and 142 becomes thin such that the insulation aspect may be destroyed. To prevent the insulation breakdown, the thickness of the first and second gate insulating layers 141 and 142 should be sufficiently thick, and as a result, there is a limit in reduction of the thickness of the display device.

However, in exemplary embodiments according to the present invention, the gate electrode G1 of the driving transistor T1 is formed under the protrusion of the polycrystalline semiconductor (the bottom gate), and as a result, the influence of the protrusion is reduced or eliminated. That is, even if the thickness of the gate insulating layer 141 is made thin, sufficient insulating characteristics may be obtained.

Unlike the driving transistor T1, the second to seventh transistors T2-T7 have the top gate structure (e.g., they do not include a bottom gate) and the gate electrode is disposed on the polycrystalline semiconductor layer including the protrusion. However, the second to seventh transistors T2-T7 do not play a major role in providing the current to the organic light emitting diode OLED, and thus, the display quality is not particularly influenced as a result of protrusions corresponding to the second to seventh transistors T2-T7. However, in an exemplary embodiment, at least some transistors from among the second to seventh transistors T2-T7 may have the bottom gate structure to further improve display characteristics.

Figure 2:
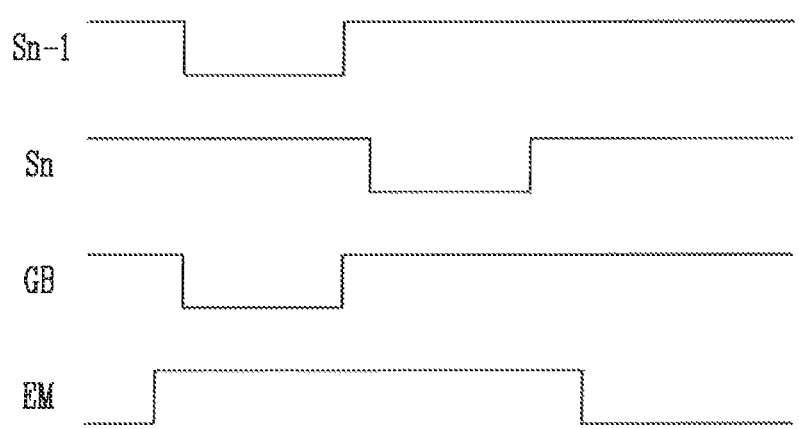
FIG. 2 is a timing diagram of signals applied to one pixel of an organic light emitting diode display according to an exemplary embodiment.

In the exemplary embodiment of FIGS. 1 to 3, the characteristic of the driving transistor T1 is shifted by forming the second gate electrode G1-2 that applies the driving voltage ELVDD in only the driving transistor T1. However, exemplary embodiments of the present invention are not limited thereto. For example, according to an exemplary embodiment, at least some transistors from among the second to seventh transistors T2-T7 may include the second gate electrode that applies the driving voltage ELVDD. Utilizing the second gate electrode in some of the second to seventh transistors T2-T7 may increase the complexity and cost of a display device compared to utilizing the second gate electrode G1-2 in only the driving transistor T1, but may further improve display characteristics.

Next, an exemplary embodiment further including a second gate electrode G2-2 that applies the driving voltage to the second transistor T2 is described with reference to FIGS. 5 and 6.

Figure 5:
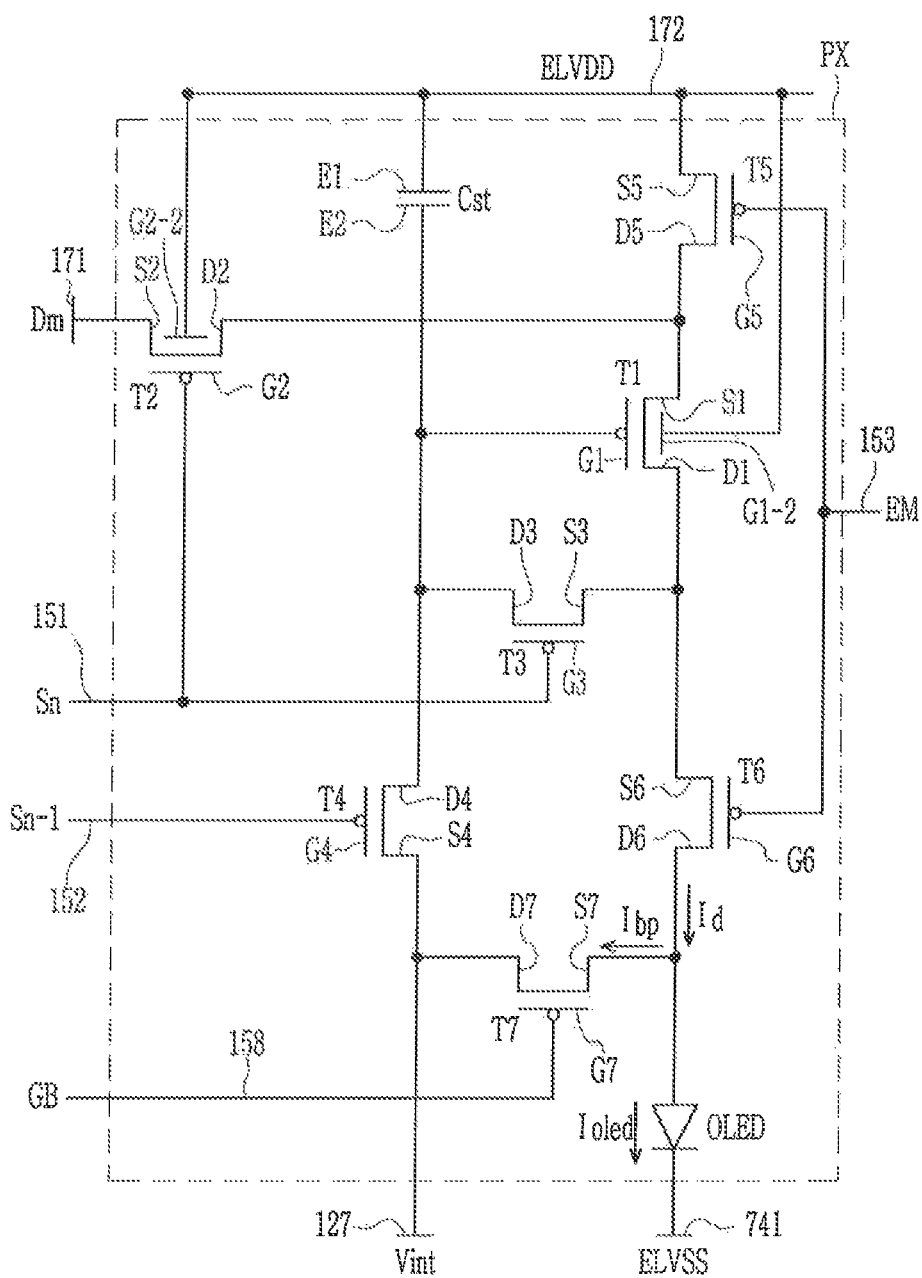
FIG. 5 is an equivalent circuit diagram of one pixel of an organic light emitting diode display according to an exemplary embodiment.

FIG. 5 is an equivalent circuit diagram of one pixel of an organic light emitting diode display according to an exemplary embodiment. FIG. 6 is a cross-sectional view of a plurality of transistors included in one pixel of an organic light emitting diode display according to an exemplary embodiment (e.g., the exemplary embodiment illustrated in FIG. 5).

Compared to the circuit diagram of FIG. 1, in the circuit diagram of FIG. 5, the second transistor T2 further includes the second gate electrode G2-2, and the second gate electrode G2-2 is connected to the driving voltage line 172. Thus, the second gate electrode G2-2 receives the driving voltage ELVDD, and as a result, the channel characteristic of the second transistor T2 is shifted in addition to the channel characteristic of the driving transistor T1.

Figure 6:
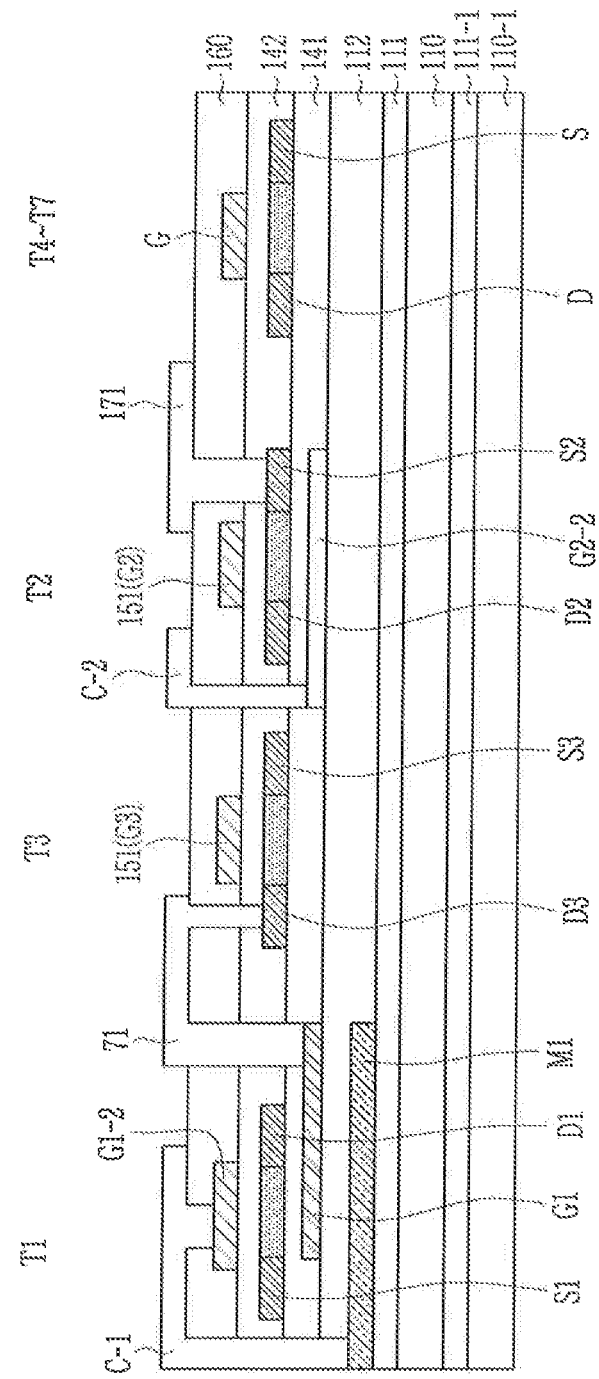
FIG. 6 is a cross-sectional view of a plurality of transistors included in one pixel of an organic light emitting diode display according to an exemplary embodiment.

Compared to the cross-sectional view of FIG. 3, in the cross-sectional view of FIG. 6, the second transistor T2 further incudes the second gate electrode G2-2, and a driving voltage application part C-2 that applies the driving voltage ELVDD to the second gate electrode G2-2 is further included.

Referring to FIGS. 5 and 6, for convenience of explanation, a further description of elements previously described may be omitted.

The cross-section of the second transistor T2 is now described in detail.

The buffer layer 112 is disposed on the upper barrier layer 111-1, and the second gate electrode G2-2 is disposed on the buffer layer 112. The second gate electrode G2-2 is covered by the first gate insulating layer 141.

The polycrystalline semiconductor layer is disposed on the first gate insulating layer 141. The polycrystalline semiconductor layer includes the first electrode S2, the second electrode D2, and the channel layer disposed therebetween.

The polycrystalline semiconductor layer is covered by the second gate insulating layer 142, and the gate electrode G2 (151) is formed on the second gate insulating layer 142. The gate electrode G2 (151) is covered by the interlayer insulating layer 160.

The data line 171 and the driving voltage application part C-2 are formed on the interlayer insulating layer 160. The data line 171 is connected to the first electrode S2 of the second transistor T2 through an opening exposing the first electrode S2 of the second transistor T2. When the second transistor T2 is turned on, the data voltage is input to the corresponding pixel PX. The driving voltage application part C-2 is connected to the second gate electrode G2-2 of the second transistor T2 through an opening exposing the second gate electrode G2-2. The driving voltage application part C-2 applies the driving voltage ELVDD to the second gate electrode G2-2. As a result, the channel characteristic of the second transistor T2 is shifted.

The gate electrode G2 is disposed on the channel of the second transistor T2, and has a width corresponding to (e.g., substantially equal to) the width of the channel. The gate electrode G2 may be used as a mask when doping the polycrystalline semiconductor layer.

As described above, the second transistor T2 includes the top gate. In addition, in the exemplary embodiment of FIGS. 5 and 6, the second gate electrode G2-2 that applies the driving voltage ELVDD is additionally included such that the channel characteristic of the second transistor T2 is also shifted.

According to an exemplary embodiment, the second transistor T2 may be formed with the bottom gate, and the second gate electrode may be formed with the top gate. In this case, the gate electrode G2 may be formed under the polycrystalline semiconductor layer such that it is connected to the scan line 151, and the second gate electrode G2-2 may be formed on the polycrystalline semiconductor layer so that the driving voltage ELVDD is applied.

Next, an exemplary embodiment further including a second gate electrode G3-2 that applies the driving voltage to the third transistor T3 is described with reference to FIGS. 7 and 8.

Figure 7:
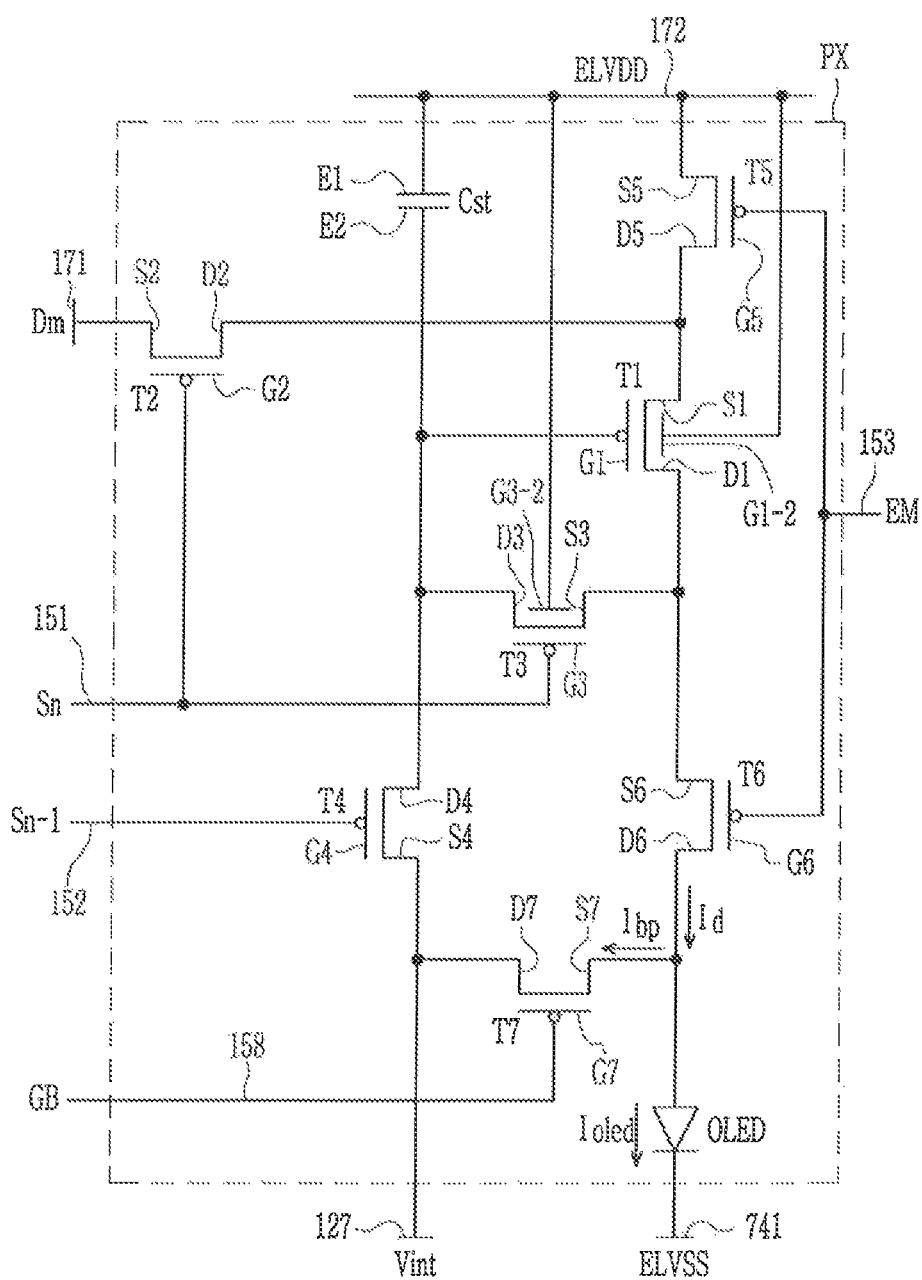
FIG. 7 is an equivalent circuit diagram of one pixel of an organic light emitting diode display according to an exemplary embodiment.

FIG. 7 is an equivalent circuit diagram of one pixel of an organic light emitting diode display according to an exemplary embodiment. FIG. 8 is a cross-sectional view of a plurality of transistors included in one pixel of an organic light emitting diode display according to an exemplary embodiment (e.g., the exemplary embodiment illustrated in FIG. 7).

Compared to the circuit diagram of FIG. 1, in the circuit diagram of FIG. 7, the third transistor T3 further includes the second gate electrode G3-2, and the second gate electrode G3-2 is connected to the driving voltage line 172. Thus, the second gate electrode G3-2 receives the driving voltage ELVDD, and as a result, the channel characteristic of the third transistor T3 is shifted in addition to the channel characteristic of the driving transistor T1.

Figure 8:
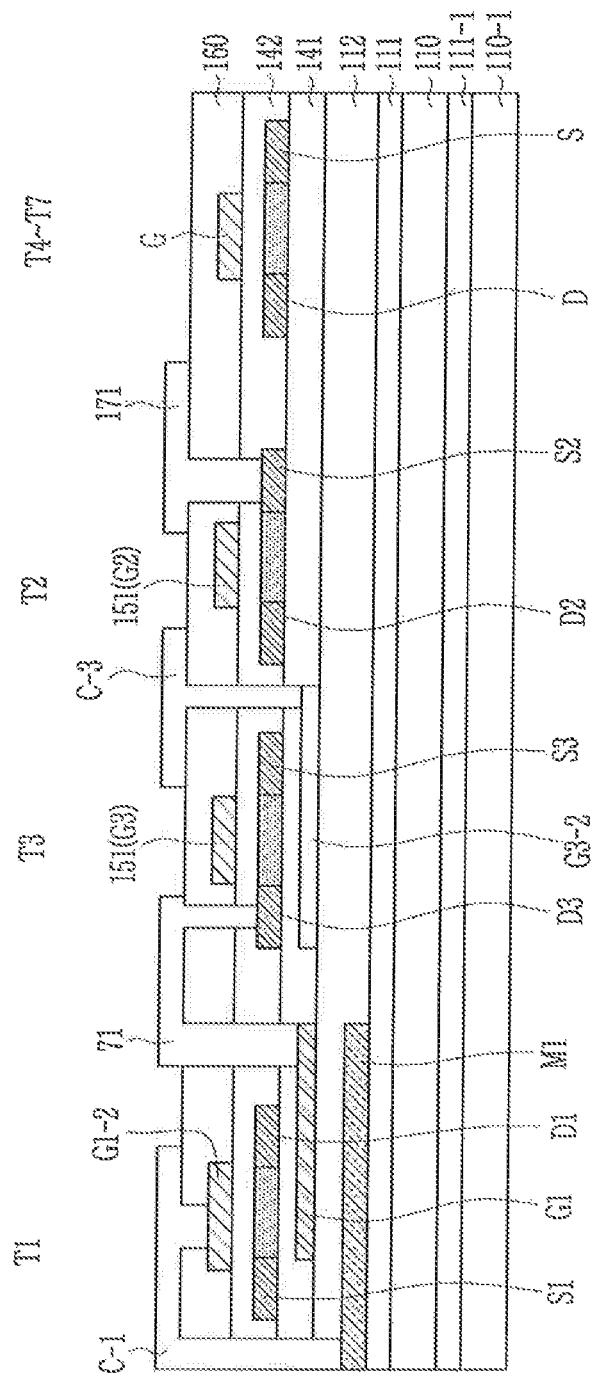
FIG. 8 is a cross-sectional view of a plurality of transistors included in one pixel of an organic light emitting diode display according to an exemplary embodiment.

Compared to the cross-sectional view of FIG. 1, in the cross-sectional view of FIG. 8, the third transistor T3 further includes the second gate electrode G3-2, and the driving voltage application part C-3 that applies the driving voltage ELVDD to the second gate electrode G3-2 is further included.

Referring to FIGS. 7 and 8, for convenience of explanation, a further description of elements previously described may be omitted.

The cross-section of the third transistor T3 is now described in detail.

The buffer layer 112 is disposed on the upper barrier layer 111-1, and the second gate electrode G3-2 is disposed on the buffer layer 112. The second gate electrode G3-2 is covered by the first gate insulating layer 141.

The polycrystalline semiconductor layer is disposed on the first gate insulating layer 141. The polycrystalline semiconductor layer includes the first electrode S3, the second electrode D3, and the channel layer disposed therebetween.

The polycrystalline semiconductor layer is covered by the second gate insulating layer 142, and the gate electrode G3 (151) is formed on the second gate insulating layer 142. The gate electrode G3 (151) is covered by the interlayer insulating layer 160.

The connection part 71 and the driving voltage application part C-3 are formed on the interlayer insulating layer 160.

The connection part 71 electrically connects the second electrode D3 of the third transistor T3 and the gate electrode G1 of the driving transistor T1 through openings respectively exposing the second electrode D3 of the third transistor T3 and the gate electrode G1 of the driving transistor T1. Since the output of the driving transistor T1 is changed according to the voltage of the gate electrode G1, the voltage output to the second electrode D3 of the third transistor T3 affects the output of the driving transistor T1.

The driving voltage application part C-3 is connected to the second gate electrode G3-2 of the third transistor T3 through an opening exposing the second gate electrode G3-2. The driving voltage application part C-3 applies the driving voltage ELVDD to the second gate electrode G3-2. As a result, the channel characteristic of the third transistor T3 is shifted.

The gate electrode G3 is disposed on the channel of the third transistor T3, and has a width corresponding to (e.g., substantially equal to) the width of the channel. The gate electrode G3 may be used as a mask when doping the polycrystalline semiconductor layer.

As described above, the third transistor T3 includes the top gate. In addition, in the exemplary embodiment of FIGS. 7 and 8, the second gate electrode G3-2 that applies the driving voltage ELVDD is additionally included such that the channel characteristic of the third transistor T3 is also shifted.

According to an exemplary embodiment, the third transistor T3 may be formed with the bottom gate, and the second gate electrode may be formed with the top gate. In this case, the gate electrode G3 is formed under the polycrystalline semiconductor layer such that it is connected to the scan line 151, and the second gate electrode G3-2 is formed on the polycrystalline semiconductor layer so as to apply the driving voltage ELVDD.

Next, a method for applying the driving voltage ELVDD to the second gate electrode G3-2 of the third transistor T3 is described with reference to FIG. 9.

Figure 9:
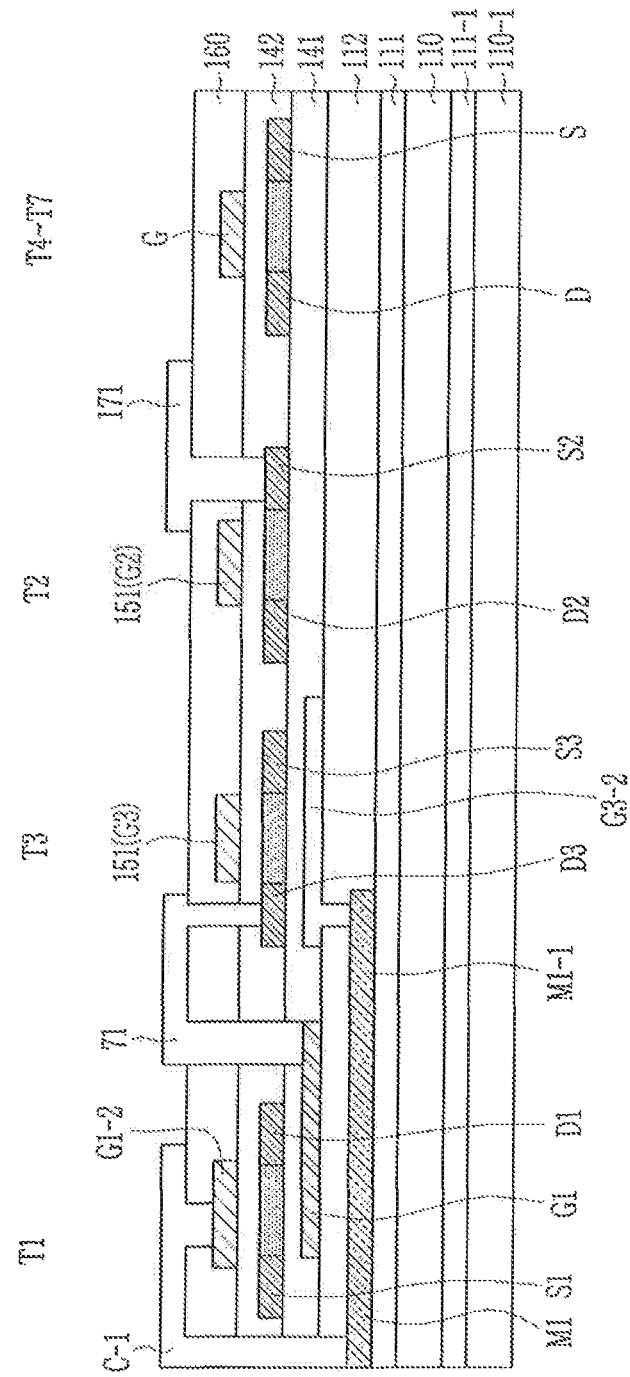
FIG. 9 is a cross-sectional view of a plurality of transistors included in one pixel of an organic light emitting diode display according to an exemplary embodiment.

FIG. 9 is a cross-sectional view of a plurality of transistors included in one pixel of an organic light emitting diode display according to an exemplary embodiment.

The cross-sectional structure of each of the transistors T1 to T7 of FIG. 9 is the same as that of FIG. 8. However, unlike the exemplary embodiment illustrated in FIG. 8, in the exemplary embodiment illustrated in FIG. 9, the driving voltage application part C-3 that applies the driving voltage ELVDD to the second gate electrode G3-2 of the third transistor T3 is omitted.

Instead, in the exemplary embodiment illustrated in FIG. 9, the second gate electrode G3-2 of the third transistor T3 receives the driving voltage ELVDD from the overlapping layer M1 disposed under the driving transistor T1.

For example, in FIG. 9, the overlapping layer M1 is disposed under the driving transistor T1, and further includes a portion M1-1 that extends under the third transistor T3. The overlapping layer M1 is connected directly to the second gate electrode G3-2 of the third transistor T3 through an opening exposing the extended overlapping layer M1. Since the overlapping layer M1 receives the driving voltage ELVDD through the driving voltage application part C-1, the driving voltage ELVDD is also applied to the second gate electrode G3-2 of the third transistor T3.

Compared to the exemplary embodiment illustrated in FIG. 8, in the exemplary embodiment illustrated in FIG. 9, the structure on the interlayer insulating layer 160 is simplified, and the structure under the polycrystalline semiconductor layer (e.g., under the gate electrode G1 of the driving transistor T1) is more complex. The transistor using the polycrystalline semiconductor layer generally uses the top gate type and generally has a more complex structure while disposing the organic light emitting diode OLED made of the pixel electrode, the organic emission layer, and the common electrode on the transistor.

Accordingly, in the exemplary embodiment illustrated in FIG. 9, the structure under the polycrystalline semiconductor layer (e.g., under the gate electrode G1 of the driving transistor T1) that is relatively simple becomes more complex, and the structure of the upper region (on the interlayer insulating layer 160) is simplified.

Since the area of the pixel PX becomes small at high resolution, the simple structure on the interlayer insulating layer 160 like in FIG. 9 may be advantageous in certain scenarios.

Next, an exemplary embodiment combining the exemplary embodiments of FIGS. 5 to 8 is described with reference to FIGS. 10 and 11.

Figure 10:
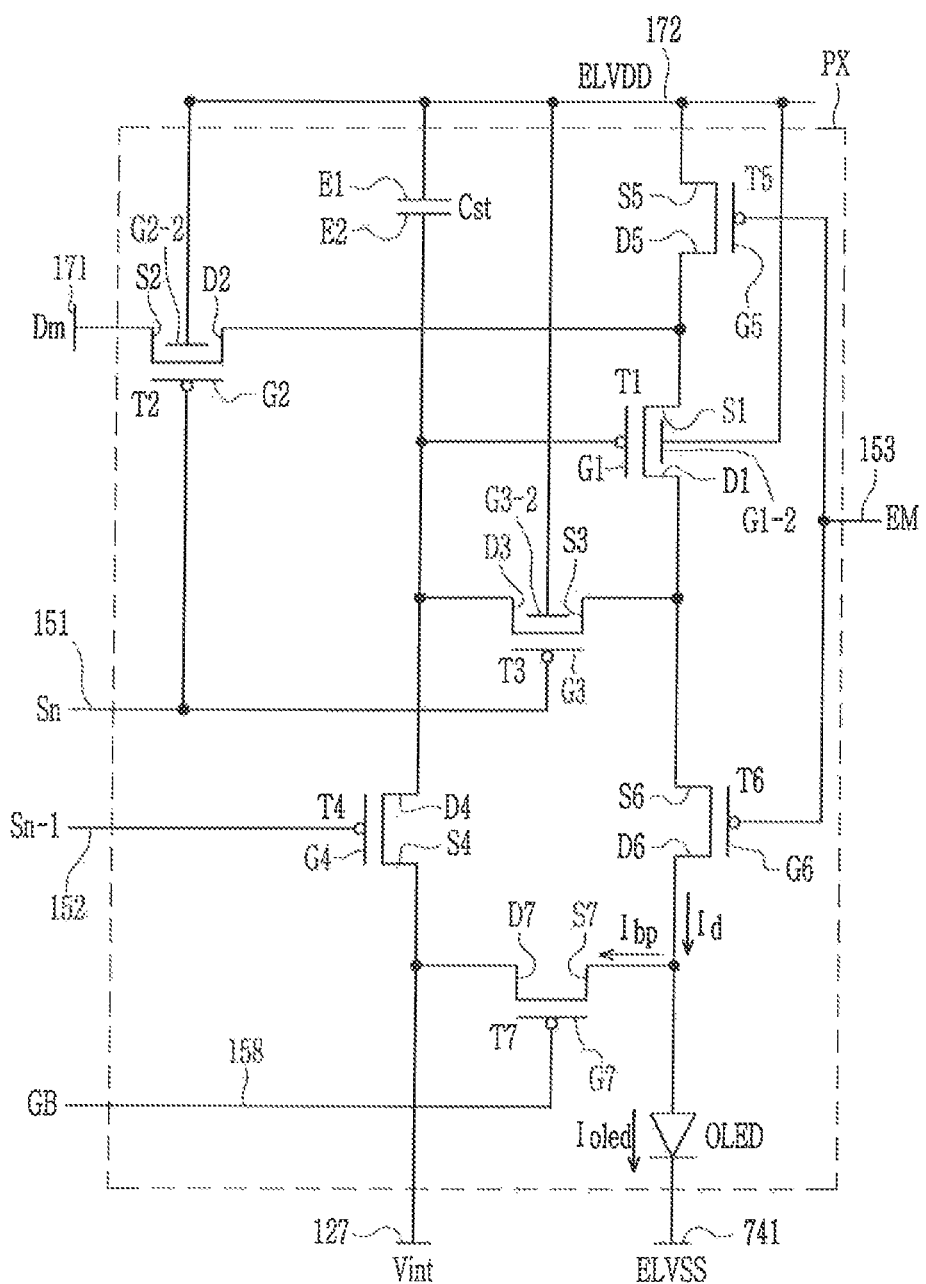
FIG. 10 is an equivalent circuit diagram of one pixel of an organic light emitting diode display according to an exemplary embodiment.

FIG. 10 is an equivalent circuit diagram of one pixel of an organic light emitting diode display according to an exemplary embodiment. FIG. 11 is a cross-sectional view of a plurality of transistors included in one pixel of an organic light emitting diode display according to an exemplary embodiment (e.g., the exemplary embodiment of FIG. 10).

Figure 11:
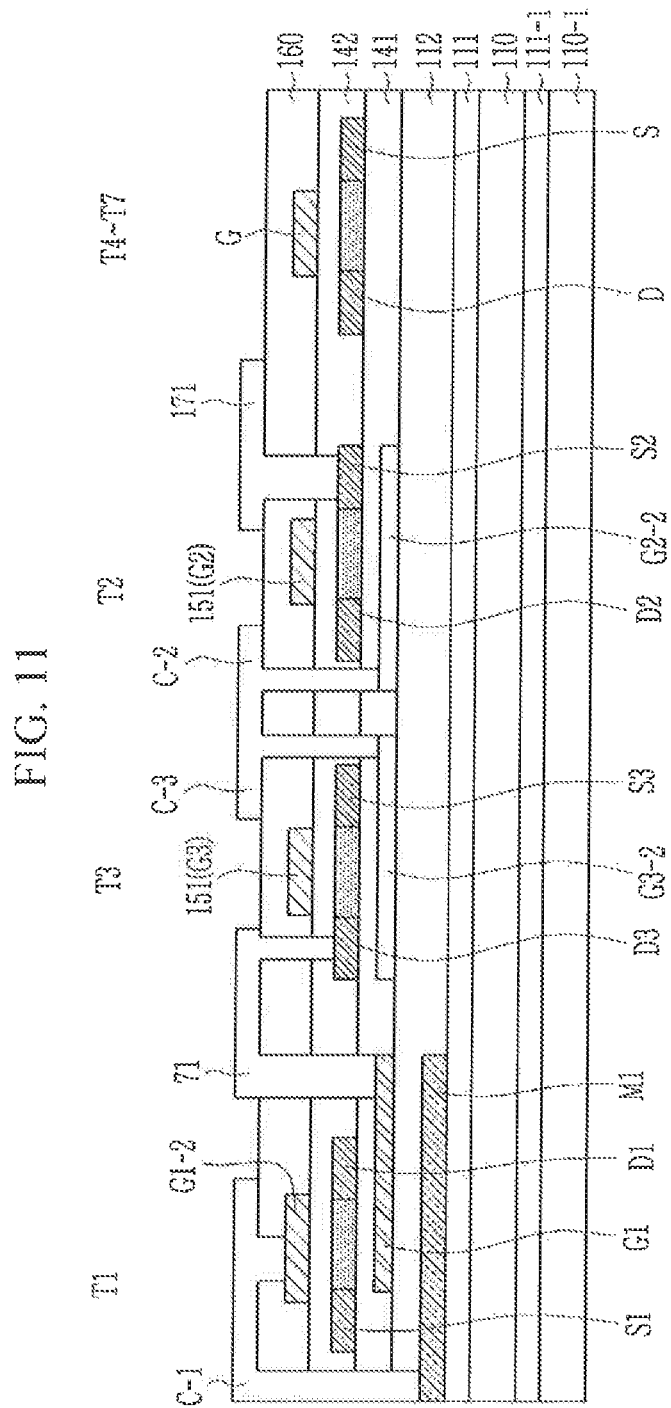
FIG. 11 is a cross-sectional view of a plurality of transistors included in one pixel of an organic light emitting diode display according to an exemplary embodiment.

Referring to FIGS. 10 and 11, for convenience of explanation, a further description of elements previously described may be omitted.

The exemplary embodiment of FIGS. 10 and 11 further includes the second gate electrode G2-2 that applies the driving voltage to the second transistor T2 (like the exemplary embodiment of FIGS. 5 and 6), and further includes the second gate electrode G3-2 that applies the driving voltage to the third transistor T3 (like the exemplary embodiment of FIGS. 7 and 8).

Compared to the circuit diagram of FIG. 1, in the circuit diagram of FIG. 10, the second transistor T2 further incudes the second gate electrode G2-2, and the third transistor T3 further includes the second gate electrode G3-2. As a result, the second gate electrode G2-2 of the second transistor T2 is connected to the driving voltage line 172, and the second gate electrode G3-2 of the third transistor T3 is also connected to the driving voltage line 172. This structure shifts the channel characteristic of the second transistor T2 and the channel characteristic of the third transistor T3.

In the cross-sectional view of FIG. 11, the characteristics of FIGS. 6 and 8 are shown together. For example, compared to the cross-sectional view of FIG. 3, the second transistor T2 further includes the second gate electrode G2-2, and the third transistor T3 further includes the second gate electrode G3-2. Also, the driving voltage application part C-2 that applies the driving voltage ELVDD to the second gate electrode G2-2 of the second transistor T2 and the driving voltage application part C-3 that applies the driving voltage ELVDD to the second gate electrode G3-2 of the third transistor T3 are further included.

The exemplary embodiment of FIG. 11 has the structure in which two driving voltage application parts C-2 and C-3 are directly connected. According to the exemplary embodiment, two driving voltage application parts C-2 and C-3 may only be electrically connected through a connection part.

As described above, the second and third transistors T2 and T3 include the top gate. However, according to an exemplary embodiment, the second and third transistors T2 and T3 may further be formed with the bottom gate and the second gate electrodes G2-2 and G3-2 may be formed with the top gate. In this case, the gate electrodes G2 and G3 may be formed under the polycrystalline semiconductor layer to be connected to the scan line 151, and the second gate electrodes G2-2 and G3-2 may be formed on the polycrystalline semiconductor layer so as to apply the driving voltage ELVDD.

Next, an exemplary embodiment further including a second gate electrode G4-2 that applies the driving voltage to the fourth transistor T4 is described with reference to FIGS. 12 and 13.

Figure 12:
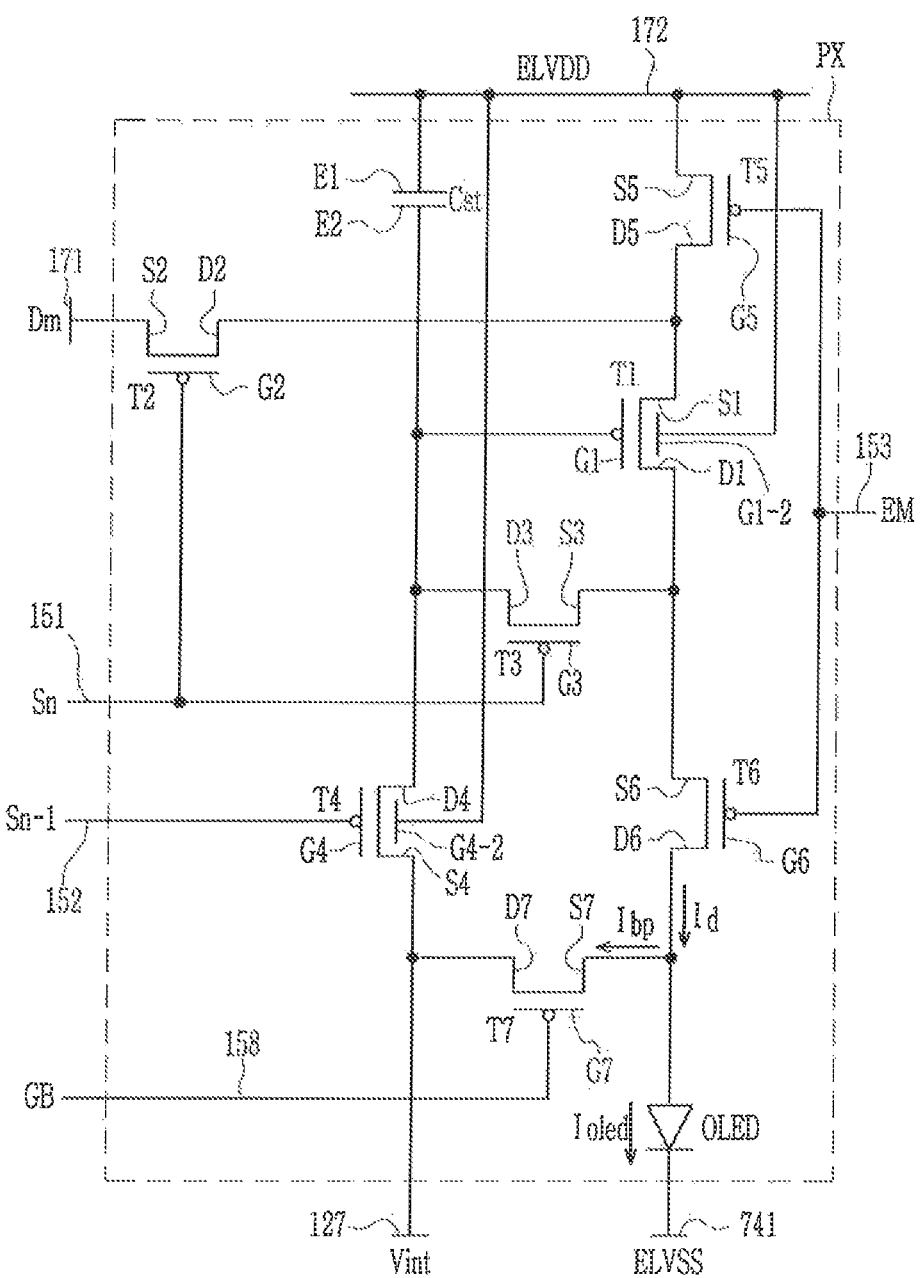
FIG. 12 is an equivalent circuit diagram of one pixel of an organic light emitting diode display according to an exemplary embodiment.

FIG. 12 is an equivalent circuit diagram of one pixel of an organic light emitting diode display according to an exemplary embodiment. FIG. 13 is a cross-sectional view of a plurality of transistors included in one pixel of an organic light emitting diode display according to an exemplary embodiment (e.g., the exemplary embodiment illustrated in FIG. 12).

Figure 13:
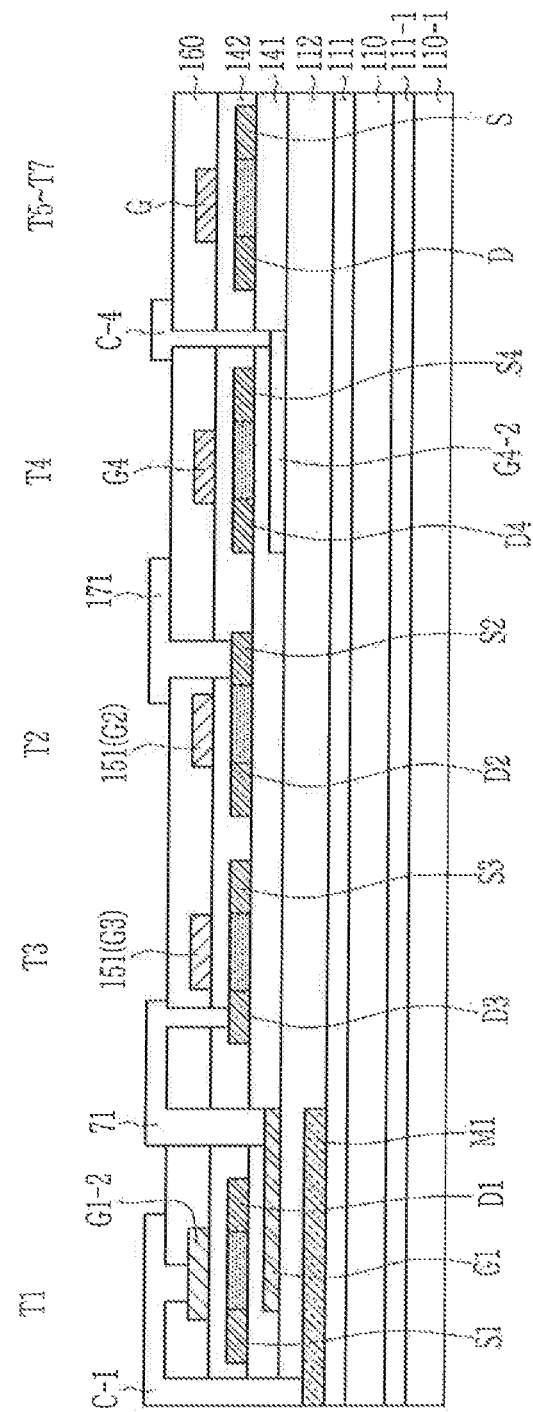
FIG. 13 is a cross-sectional view of a plurality of transistors included in one pixel of an organic light emitting diode display according to an exemplary embodiment.

Referring to FIGS. 12 and 13, for convenience of explanation, a further description of elements previously described may be omitted.

Compared to the circuit diagram of FIG. 1, in the circuit diagram of FIG. 12, the fourth transistor T4 further includes the second gate electrode G4-2, and the second gate electrode G4-2 is connected to the driving voltage line 172. Thus, the second gate electrode G4-2 receives the driving voltage ELVDD, and as a result, the channel characteristic of the fourth transistor T4 is shifted.

Compared to the cross-sectional view of FIG. 3, in the cross-sectional view of FIG. 13, the fourth transistor T4 further includes the second gate electrode G4-2, and the driving voltage application part C-4 that applies the driving voltage ELVDD to the second gate electrode G4-2 is further included.

The cross-section of the fourth transistor T4 is now described in detail.

The buffer layer 112 is disposed on the upper barrier layer 111-1, and the second gate electrode G4-2 is disposed on the buffer layer 112. The second gate electrode G4-2 is covered by the first gate insulating layer 141.

The polycrystalline semiconductor layer is disposed on the first gate insulating layer 141. The polycrystalline semiconductor layer includes the first electrode S4, the second electrode D4, and the channel layer disposed therebetween.

The polycrystalline semiconductor layer is covered by the second gate insulating layer 142, and the gate electrode G4 is formed on the second gate insulating layer 142. The gate electrode G4 is covered by the interlayer insulating layer 160.

The driving voltage application part C-4 is formed on the interlayer insulating layer 160. The driving voltage application part C-4 is connected to the second gate electrode G4-2 of the second transistor T4 though an opening exposing the second gate electrode G4-2. The driving voltage application part C-4 applies the driving voltage ELVDD to the second gate electrode G4-2. As a result, the channel characteristic of the fourth transistor T4 is shifted.

The gate electrode G4 is disposed on the channel of the fourth transistor T4, and has a width corresponding to (e.g., substantially equal to) the width of the channel. The gate electrode G4 may be used as a mask when doping the polycrystalline semiconductor layer.

As described above, the fourth transistor T4 includes the top gate. However, in an exemplary embodiment, the second gate electrode G4-2 that applies the driving voltage ELVDD is additionally formed such that the channel characteristic of the fourth transistor T4 is also shifted.

According to an exemplary embodiment, the fourth transistor T4 may include the bottom gate and the second gate electrode G4-2 may include the top gate. In this case, the gate electrode G4 may be formed under the polycrystalline semiconductor layer, and the second gate electrode G4-2 may be formed on the polycrystalline semiconductor layer so as to apply the driving voltage ELVDD.

An exemplary embodiment including the characteristic (further including the second gate electrode G4-2 that applies the driving voltage to the fourth transistor T4) of the exemplary embodiment of FIGS. 12 and 13 along with the characteristic of the above-described exemplary embodiments may be provided. For example, in addition to the exemplary embodiment of FIGS. 12 and 13, the second transistor T2 may further include the second gate electrode G2-2 that applies the driving voltage, or the third transistor T3 may further include the second gate electrode G3-2 that applies the driving voltage. Also, the second gate electrodes G2-2 and G3-2 that receive the driving voltage may be included in both the second transistor T2 and the third transistor T3.

In an exemplary embodiment, the fifth transistor T5 to the seventh transistor T7 may also further include the second gate electrode that receives the driving voltage.

In an exemplary embodiment described above, only the driving transistor T1 uses the bottom gate structure (the gate electrode is disposed under the polycrystalline semiconductor layer), and the other transistors T2-T7 use the top gate structure (the gate electrode is disposed on the polycrystalline semiconductor layer).

However, according to an exemplary embodiment, the bottom gate structure may be used in transistors other that the driving transistor T1 such that the influence on the characteristic of the transistors other than the driving transistor T1 due to the protrusion of the polycrystalline semiconductor may be reduced.

Next, an exemplary embodiment in which the second transistor T2 and the third transistor T3 have the bottom gate structure is described with reference to FIG. 14.

Figure 14:
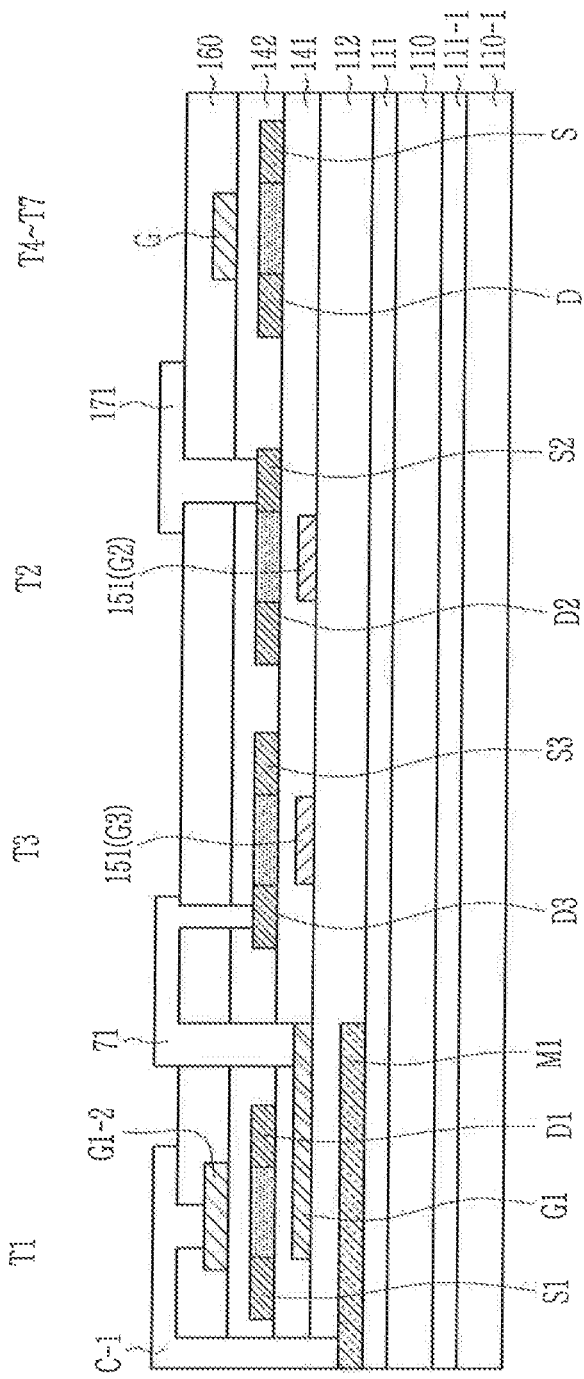
FIG. 14 is a cross-sectional view of a plurality of transistors included in one pixel of an organic light emitting diode display according to an exemplary embodiment.

FIG. 14 is a cross-sectional view of a plurality of transistors included in one pixel of an organic light emitting diode display according to an exemplary embodiment.

In the exemplary embodiment of FIG. 14, unlike in the exemplary embodiment of FIG. 3, the second transistor T2 and the third transistor T3 use the bottom gate structure. Next, the structure of the second transistor T2 and the third transistor T3 is described in detail.

The cross-section of the second transistor T2 is described first.

The buffer layer 112 is disposed on the upper barrier layer 111-1, and the gate electrodes G2 and 151 are disposed on the buffer layer 112. The gate electrode G2 (151) is covered by the first gate insulating layer 141.

The polycrystalline semiconductor layer is disposed on the first gate insulating layer 141. The polycrystalline semiconductor layer includes the first electrode S2, the second electrode D2, and the channel layer disposed therebetween.

The polycrystalline semiconductor layer is covered by the second gate insulating layer 142, and the interlayer insulating layer 160 is formed on the second gate insulating layer 142.

The data line 171 is formed on the interlayer insulating layer 160. The data line 171 is connected to the first electrode S2 of the second transistor T2 through an opening exposing the first electrode S2 of the second transistor T2. When the second transistor T2 is turned on, the data voltage is input to the corresponding pixel PX.

The gate electrode G2 of the second transistor T2 is disposed under the polycrystalline semiconductor layer such that it has the bottom gate structure, and the gate electrode G2 has a width corresponding to (e.g., substantially equal to)

the width of the channel. Also, since the gate electrode G2 is disposed under the polycrystalline semiconductor layer, a mask may be separately utilized when doping the polycrystalline semiconductor layer.

In the exemplary embodiment of FIG. 14, the second transistor T2 does not separately include the structure shifting the channel characteristic, and according to an exemplary embodiment, the driving voltage ELVDD may be applied and the second gate electrode disposed on the polycrystalline semiconductor layer may be formed.

Next, the cross-section of the third transistor T3 is described.

The buffer layer 112 is disposed on the upper barrier layer 111-1, and the gate electrode G3 (151) is disposed on the buffer layer 112. The gate electrode G3 (151) is covered by the first gate insulating layer 141.

The polycrystalline semiconductor layer is disposed on the first gate insulating layer 141. The polycrystalline semiconductor layer includes the first electrode S3, the second electrode D3, and the channel layer disposed therebetween.

The polycrystalline semiconductor layer is covered by the second gate insulating layer 142, and the interlayer insulating layer 160 is formed on the second gate insulating layer 142.

The connection part 71 is formed on the interlayer insulating layer 160. The connection part 71 electrically connects the second electrode D3 of the third transistor T3 and the gate electrode G1 of the driving transistor T1 through openings respectively exposing the second electrode D3 of the third transistor T3 and the gate electrode G1 of the driving transistor T1. Since the output of the driving transistor T1 is changed depending on the voltage of the gate electrode G1, the voltage output to the second electrode D3 of the third transistor T3 affects to the output of the driving transistor T1.

The gate electrode G3 of the third transistor T3 is disposed under the polycrystalline semiconductor layer such that it has the bottom gate structure, and the gate electrode G3 has a width corresponding to (e.g., substantially equal to) the width of the channel. Since the gate electrode G3 is disposed under the polycrystalline semiconductor layer, a mask may be separately utilized when doping the polycrystalline semiconductor layer.

In the exemplary embodiment of FIG. 14, the third transistor T3 does not separately include the structure shifting the channel characteristic, and according to an exemplary embodiment, the driving voltage ELVDD may be applied and the second gate electrode disposed on the polycrystalline semiconductor layer may be formed.

Unlike the exemplary embodiment of FIG. 14, only one of the second transistor T2 and the third transistor T3 includes the bottom gate structure. Also, in an exemplary embodiment, one transistor from among the fourth to seventh transistors T4 to T7 may have the bottom gate structure.

In addition to this structure, at least one transistor from among the second to seventh transistors T2-T7 may further include the second gate electrode that receives the driving voltage ELVDD.

In the exemplary embodiment described above, the driving transistor T1 further includes the second gate electrode G1-2 on the polycrystalline semiconductor layer while having the bottom gate structure. However, according to an exemplary embodiment, the second gate electrode G1-2 may be omitted. This structure is now described with reference to FIG. 15.

Figure 15:
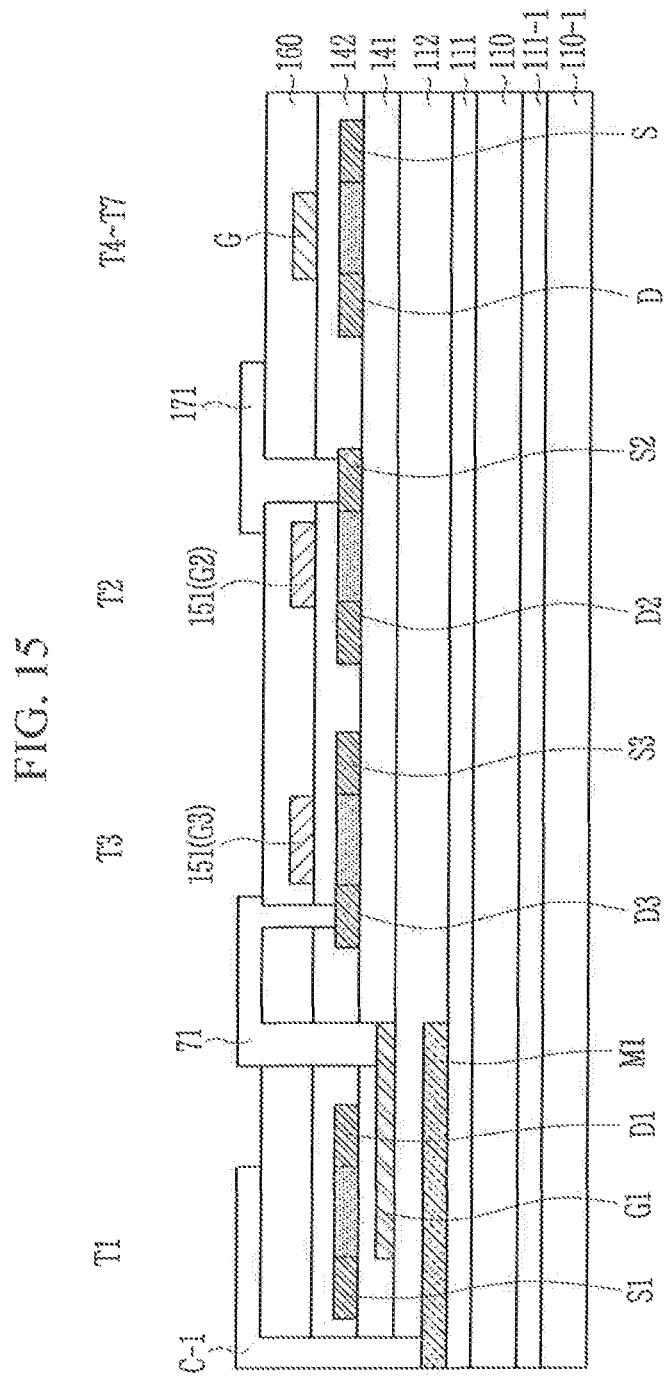
FIG. 15 is a cross-sectional view of a plurality of transistors included in one pixel of an organic light emitting diode display according to an exemplary embodiment.

FIG. 15 is a cross-sectional view of a plurality of transistors included in one pixel of an organic light emitting diode display according to an exemplary embodiment.

In the driving transistor T1 according to the exemplary embodiment of FIG. 15, the second gate electrode G1-2 is omitted, unlike the exemplary embodiment of FIG. 1.

The cross-section of the driving transistor T1 according to the exemplary embodiment of FIG. 15 is now described.

The overlapping layer M1 is disposed on the upper barrier layer 111-1, and the overlapping layer is covered by the buffer layer 112. The gate electrode G1 is formed on the buffer layer 112, and the gate electrode G1 is covered by the first gate insulating layer 141. The polycrystalline semiconductor layer is disposed on the first gate insulating layer 141. The polycrystalline semiconductor layer includes the first electrode S1, the second electrode D1, and the channel layer disposed therebetween.

The polycrystalline semiconductor layer is covered by the second gate insulating layer 142, and the interlayer insulating layer 160 is disposed on the second gate insulating layer 142.

The driving voltage application part C-1 is formed on the interlayer insulating layer 160. The driving voltage application part C-1 is connected to the overlapping layer M1 through an opening exposing the overlapping layer M1. Also, the driving voltage application part C-1 is connected to the driving voltage line 172 such that the driving voltage ELVDD flows. As a result, the driving voltage ELVDD is also applied to the overlapping layer M1. The driving voltage application part C-1 may be a part that extends from the driving voltage line 172 or a part that is only electrically connected.

The gate electrode G1 is disposed under the channel of the driving transistor T1, and the gate electrode G1 has a width corresponding to (e.g., substantially equal to) the width of the channel. FIG. 15 shows a structure in which the gate electrode G1 extends to the right to be connected to the second electrode D3 of the third transistor T3, and the width thereof, except for the extended part, corresponds to (e.g., is substantially equal to) the width of the channel.

In the driving transistor T1 of FIG. 15, the second gate electrode is not formed on the polycrystalline semiconductor layer such that a mask may be separately utilized when doping the polycrystalline semiconductor layer. According to an exemplary embodiment, the structure of the driving voltage application part C-1 may be formed of the shape covering the channel of the driving transistor T1 such that an exemplary embodiment that does not use the mask may be implemented.

According to an exemplary embodiment, the overlapping layer M1 may be omitted.

In each exemplary embodiment described herein, the wiring and the electrode disposed at the same layer may be formed of the same material. The layer disposed on the second gate insulating layer 142 may be formed of the same material, and may be formed by using one mask. Also, each layer disposed on the upper barrier layer 111, on the buffer layer 112, on the first gate insulating layer 141, and on the interlayer insulating layer 160 may be formed of the same material.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An organic light emitting diode display, comprising:
a substrate;
a pixel disposed on the substrate;
a scan line;
a data line;
a driving voltage line; and
an initialization voltage line,
wherein the scan line, the data line, the driving voltage line, and the initialization voltage line are connected to the pixel,
wherein the pixel comprises:
an organic light emitting element;
a first switching transistor connected to the scan line;
a driving transistor that applies a current to the organic light emitting element; and
a compensation transistor that compensates an operation of the driving transistor,
wherein the driving transistor comprises:
a bottom electrode; and
a semiconductor layer comprising a channel,
wherein the compensation transistor comprises:
a semiconductor layer comprising a channel;
a first gate electrode disposed on the semiconductor layer of the compensation transistor; and
a second gate electrode disposed under the semiconductor layer of the compensation transistor,
wherein the bottom electrode of the driving transistor is disposed between the semiconductor layer of the driving transistor and the substrate.

2. The organic light emitting diode display of claim 1, wherein the driving transistor further comprises:
a top gate electrode disposed on the semiconductor layer of the driving transistor.

3. The organic light emitting diode display of claim 2, wherein the top gate electrode of the driving transistor receives a driving voltage.

4. The organic light emitting diode display of claim 3, wherein the driving transistor further comprises:
an overlapping layer disposed between the substrate and the bottom electrode of the driving transistor.

5. The organic light emitting diode display of claim 4, wherein the driving voltage that flows to the driving voltage line is applied to the overlapping layer.

6. The organic light emitting diode display of claim 5, further comprising:
a driving voltage application part that applies the driving voltage to the overlapping layer and the top gate electrode of the driving transistor.

7. The organic light emitting diode display of claim 1, wherein the pixel further comprises:
a second switching transistor,
wherein the first switching transistor is connected to the scan line and the data line, and the second switching transistor is connected to the scan line and the driving transistor.

8. The organic light emitting diode display of claim 7, wherein the first switching transistor comprises:
a semiconductor layer comprising a channel; and
a first gate electrode disposed on the semiconductor layer of the first switching transistor.

9. The organic light emitting diode display of claim 8, wherein the first switching transistor further comprises:
a second gate electrode disposed under the semiconductor layer of the first switching transistor.

10. The organic light emitting diode display of claim 7, wherein the first switching transistor comprises:
a gate electrode disposed on the substrate; and
a semiconductor layer disposed on the gate electrode of the first switching transistor and comprising a channel.

11. The organic light emitting diode display of claim 7, wherein the second switching transistor comprises:
a semiconductor layer comprising a channel; and
a first gate electrode disposed on the semiconductor layer of the second switching transistor.

12. The organic light emitting diode display of claim 11, wherein the second switching transistor further comprises:
a second gate electrode disposed under the semiconductor layer of the second switching transistor.

13. The organic light emitting diode display of claim 12, wherein the first switching transistor comprises:
a semiconductor layer comprising a channel; and
a first gate electrode disposed on the semiconductor layer of the first switching transistor.

14. The organic light emitting diode display of claim 13, wherein the first switching transistor further comprises:
a second gate electrode disposed under the semiconductor layer of the first switching transistor.

15. The organic light emitting diode display of claim 12, wherein the driving transistor further comprises:
an overlapping layer disposed between the substrate and the bottom electrode of the driving transistor,
wherein the overlapping layer receives the driving voltage, and
the overlapping layer is electrically connected to the second gate electrode of the second switching transistor such that the driving voltage is applied to the second gate electrode of the second switching transistor.

16. The organic light emitting diode display of claim 15, further comprising:
a driving voltage application part,
wherein the driving transistor further comprises a top gate electrode disposed on the semiconductor layer of the driving transistor, and
the driving voltage application part applies the driving voltage to the overlapping layer and the top gate electrode of the driving transistor.

17. The organic light emitting diode display of claim 7, wherein the second switching transistor comprises:
a gate electrode disposed on the substrate; and
a semiconductor layer disposed on the gate electrode of the second switching transistor and comprising a channel.

18. The organic light emitting diode display of claim 1, wherein the compensation transistor initializes the bottom electrode of the driving transistor.

19. An organic light emitting diode display, comprising:
a substrate;
a pixel disposed on the substrate;
a scan line;
a data line;
a driving voltage line; and
an initialization voltage line,
wherein the scan line, the data line, the driving voltage line, and the initialization voltage line are connected to the pixel,
wherein the pixel comprises:
an organic light emitting element;
a first switching transistor connected to the scan line;
a driving transistor that applies a current to the organic light emitting element; and
a compensation transistor that compensates an operation of the driving transistor, wherein the driving transistor comprises:
a bottom electrode;
a semiconductor layer comprising a channel; and
a top gate electrode disposed on the semiconductor layer of the driving transistor;
wherein the compensation transistor comprises:
a semiconductor layer comprising a channel;
a top electrode disposed on the semiconductor layer of the compensation transistor; and
a second gate electrode disposed under the semiconductor layer of the compensation transistor,
wherein the bottom electrode of the driving transistor is disposed between the semiconductor layer of the driving transistor and the substrate.

* * * * *